(12) United States Patent
Park

(10) Patent No.: US 11,295,817 B2
(45) Date of Patent: Apr. 5, 2022

(54) PAGE BUFFER AND SEMICONDUCTOR MEMORY DEVICE HAVING THE SAME

(71) Applicant: SK hynix Inc., Gyeonggi-do (KR)

(72) Inventor: Kang Woo Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/950,385

(22) Filed: Nov. 17, 2020

(65) Prior Publication Data

US 2021/0407597 A1 Dec. 30, 2021

(30) Foreign Application Priority Data

Jun. 25, 2020 (KR) ........................ 10-2020-0077974

(51) Int. Cl.
| | |
|---|---|
| *G11C 7/00* | (2006.01) |
| *G11C 16/26* | (2006.01) |
| *G11C 16/24* | (2006.01) |
| *G11C 16/04* | (2006.01) |

(52) U.S. Cl.
CPC .......... *G11C 16/26* (2013.01); *G11C 16/0483* (2013.01); *G11C 16/24* (2013.01)

(58) Field of Classification Search
CPC ....... G11C 7/1051; G11C 7/1078; G11C 7/22; G11C 7/106; G11C 7/1057

USPC ........................................ 365/189.05, 189.15
See application file for complete search history.

(56) References Cited

U.S. PATENT DOCUMENTS

| | | | |
|---|---|---|---|
| 9,672,879 B1* | 6/2017 | Lee | ........................ G11C 16/26 |
| 11,004,484 B2* | 5/2021 | Cho | ...................... G11C 7/1039 |

FOREIGN PATENT DOCUMENTS

| | | |
|---|---|---|
| KR | 10-0732257 | 6/2007 |
| KR | 10-2018-0116393 | 10/2018 |

* cited by examiner

*Primary Examiner* — Son T Dinh
(74) *Attorney, Agent, or Firm* — IP & T Group LLP

(57) ABSTRACT

Provided herein may be a page buffer and a semiconductor memory device having the same. The page buffer may include a sensing node, of which a potential is controlled based on an amount of current flowing through a bit line during a data sensing operation and based on a potential of a page buffer common node during a data transmission operation, and a main latch component configured to latch data based on the potential of the sensing node, wherein the main latch component latches the data depending on a first trip voltage and the potential of the sensing node during the data transmission operation, and latches the data depending on a second trip voltage and the potential of the sensing node during the data sensing operation, the first trip voltage and the second trip voltage being different.

28 Claims, 18 Drawing Sheets

PAGE BUFFER AND SEMICONDUCTOR MEMORY DEVICE HAVING THE SAME

CROSS-REFERENCE TO RELATED APPLICATION

The present application claims priority under 35 U.S.C. § 119(a) to Korean patent application number 10-2020-0077974, filed on Jun. 25, 2020, which is incorporated herein by reference in its entirety.

BACKGROUND

Field of Invention

Various embodiments of the present disclosure relate to an electronic device, and more particularly to a page buffer and a semiconductor memory device having the page buffer.

Description of Related Art

Semiconductor memory devices are fabricated using a semiconductor such as silicon (Si), germanium (Ge), gallium arsenide (GaAs), or indium phosphide (InP). Generally, a semiconductor memory device is one of two types: a volatile memory device or a nonvolatile memory device.

In a volatile memory device stored data is lost when supply of power to the device is interrupted. Representative examples of volatile memory devices include a static random access memory (SRAM), a dynamic RAM (DRAM), and a synchronous DRAM (SDRAM). In a nonvolatile memory device stored data is retained even when supply of power to the device is interrupted. Representative examples of nonvolatile memory devices include a read only memory (ROM), a programmable ROM (PROM), an electrically programmable ROM (EPROM), an electrically erasable programmable ROM (EEPROM), a flash memory, a phase-change RAM (PRAM), a magnetic RAM (MRAM), a resistive RAM (RRAM), and a ferroelectric RAM (FRAM). A flash memory is chiefly classified as a NOR type or a NAND type.

SUMMARY

Various embodiments of the present disclosure are directed to a page buffer that may improve data transmission operation performance and data sensing operation performance, and a semiconductor memory device having the page buffer.

An embodiment of the present disclosure may provide for a page buffer. The page buffer may include a sensing node, of which a potential is controlled based on an amount of current flowing through a bit line during a data sensing operation and based on a potential of a page buffer common node during a data transmission operation, and a main latch component configured to latch data based on the potential of the sensing node, wherein the main latch component latches the data depending on a first trip voltage and the potential of the sensing node during the data transmission operation, and latches the data depending on a second trip voltage and the potential of the sensing node during the data sensing operation, the first trip voltage and the second trip voltage being different.

An embodiment of the present disclosure may provide for a page buffer. The page buffer may include a sensing node, a potential of which is controlled based on an amount of current flowing through a bit line during a data sensing operation and based on a potential of a page buffer common node during a data transmission operation, and a main latch component configured to latch data based on the potential of the sensing node, wherein the main latch component is further configured to, during the data transmission operation, set a first trip voltage by relatively strengthening a pull-down current path to latch the data depending on the set first trip voltage and the potential of the sensing node, and during the data sensing operation, set a second trip voltage higher than the first trip voltage by relatively weakening the pull-down current path to latch the data depending on the set second trip voltage and the potential of the sensing node.

An embodiment of the present disclosure may provide for a semiconductor memory device. The semiconductor memory device may include a first precharger coupled to a page buffer common node and configured to precharge the page buffer common node to a first potential during a data transmission operation, a cache latch component coupled to the page buffer common node and configured to maintain or discharge a potential of the page buffer common node based on data stored therein in the data transmission operation, and a page buffer coupled to the page buffer common node, wherein the page buffer may include a sensing node, a potential of which is controlled based on the potential of the page buffer common node during the data transmission operation, and a main latch component configured to latch data based on the potential of the sensing node, and wherein the main latch component is further configured to sets a first trip voltage to latch the data depending on the set first trip voltage and the potential of the sensing node during the data transmission operation.

DETAILED DESCRIPTION

Specific structural and functional description is provided herein to describe embodiments of the present disclosure. The present invention, however, may be configured or arranged in various other forms, and thus the invention is not limited to the disclosed embodiments.

Various embodiments of the present disclosure are described more fully below with reference to the accompanying drawings, so that those skilled in the art can easily practice the present invention. Throughout the specification, reference to "an embodiment," "another embodiment" or the like is not necessarily to only one embodiment, and different references to any such phrase are not necessarily to the same embodiment(s). Also, the term "embodiments" when used herein does not necessarily refer to all embodiments.

Figure 1:
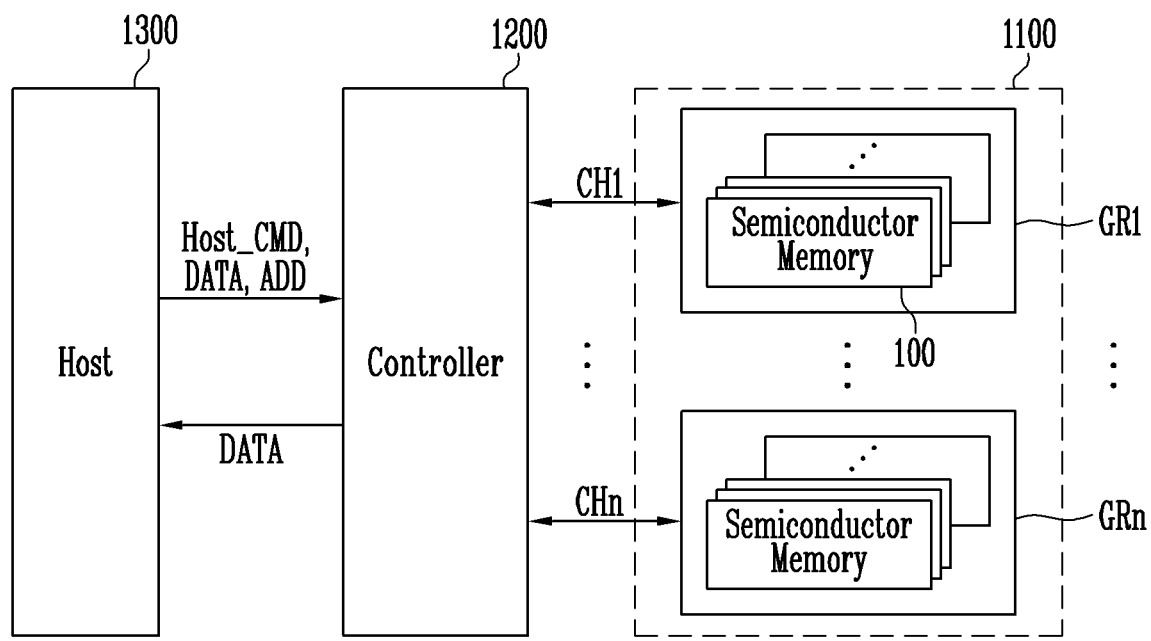
FIG. 1 is a block diagram illustrating a memory system including a memory device according to an embodiment of the present disclosure.

FIG. 1 is a block diagram illustrating a memory system including a memory device according to an embodiment of the present disclosure.

Referring to FIG. 1, a memory system 1000 may include a memory device 1100, a controller 1200, and a host 1300. The memory device 1100 may include a plurality of semiconductor memories (or semiconductor memory devices) 100. The plurality of semiconductor memories 100 may be divided into a plurality of groups GR1 to GRn. In another embodiment of the present disclosure, the memory system 1000 may be configured to include only the controller 1200 and the memory device 1100, with the host 1300 being disposed external to the memory system 1000.

In FIG. 1, it is illustrated that the plurality of groups GR1 to GRn of semiconductor memory devices 100 communicate with the controller 1200 through first to n-th channels CH1 to CHn, respectively. A semiconductor memory 100 is described in detail below with reference to FIG. 2.

Each semiconductor memory 100 of a particular group may communicate with the controller 1200 through one common channel. The controller 1200 may control the semiconductor memories 100 of the memory device 1100 through the plurality of channels CH1 to CHn.

The controller 1200 is coupled between the host 1300 and the memory device 1100. The controller 1200 may access the memory device 1100 in response to a request from the host 1300. For example, the controller 1200 may control a read operation, a program operation, an erase operation, and a background operation of the memory device 1100 in response to a host command Host_CMD received from the host 1300. The host 1300 may transmit an address ADD and data to be programmed DATA, together with the host command Host_CMD, during a program operation, and may transmit an address ADD, together with the host command Host_CMD, during a read operation. During the program operation, the controller 1200 may transmit the command corresponding to the program operation and the data to be programmed DATA to the memory device 1100. During the read operation, the controller 1200 may transmit the command corresponding to the read operation to the memory device 1100, receive read data DATA from the memory device 1100, and transmit the received data DATA to the host 1300. The controller 1200 may provide an interface between the memory device 1100 and the host 1300. The controller 1200 may run firmware for controlling the memory device 1100.

The host 1300 may be configured as any of various portable electronic devices, such as a computer, a personal digital assistant (PDA), a portable multimedia player (PMP), an MP3 player, a camera, a camcorder, and/or a mobile phone. The host 1300 may request the program operation, the read operation, and the erase operation of the memory system 1000 through the host command Host_CMD. The host 1300 may transmit the host command Host_CMD corresponding to the program operation, the data DATA, and the address ADD to the controller 1200 so as to perform the program operation of the memory device 1100, and may transmit the host command Host_CMD corresponding to the read operation and the address ADD to the controller 1200 so as to perform the read operation. Here, the address ADD may be the logical address of the data.

The controller 1200 and the memory device 1100 may be integrated into a single semiconductor memory device. In an embodiment, the controller 1200 and the memory device 1100 may be integrated into a single semiconductor memory device to form a memory card, such as a personal computer memory card international association (PCMCIA), a compact flash card (CF), a smart media card (SM or SMC), a memory stick, a multimedia card (MMC, RS-MMC, or MMCmicro), an SD card (SD, miniSD, microSD, or SDHC), or a universal flash storage (UFS).

In an embodiment, the memory system 1000 may be provided as one of various elements of an electronic device such as a computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the memory device 1100 or the memory system 1000 may be mounted as any of various types of packages. For example, the memory device 1100 or the memory system 1000 may be packaged and mounted in Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

Figure 2:
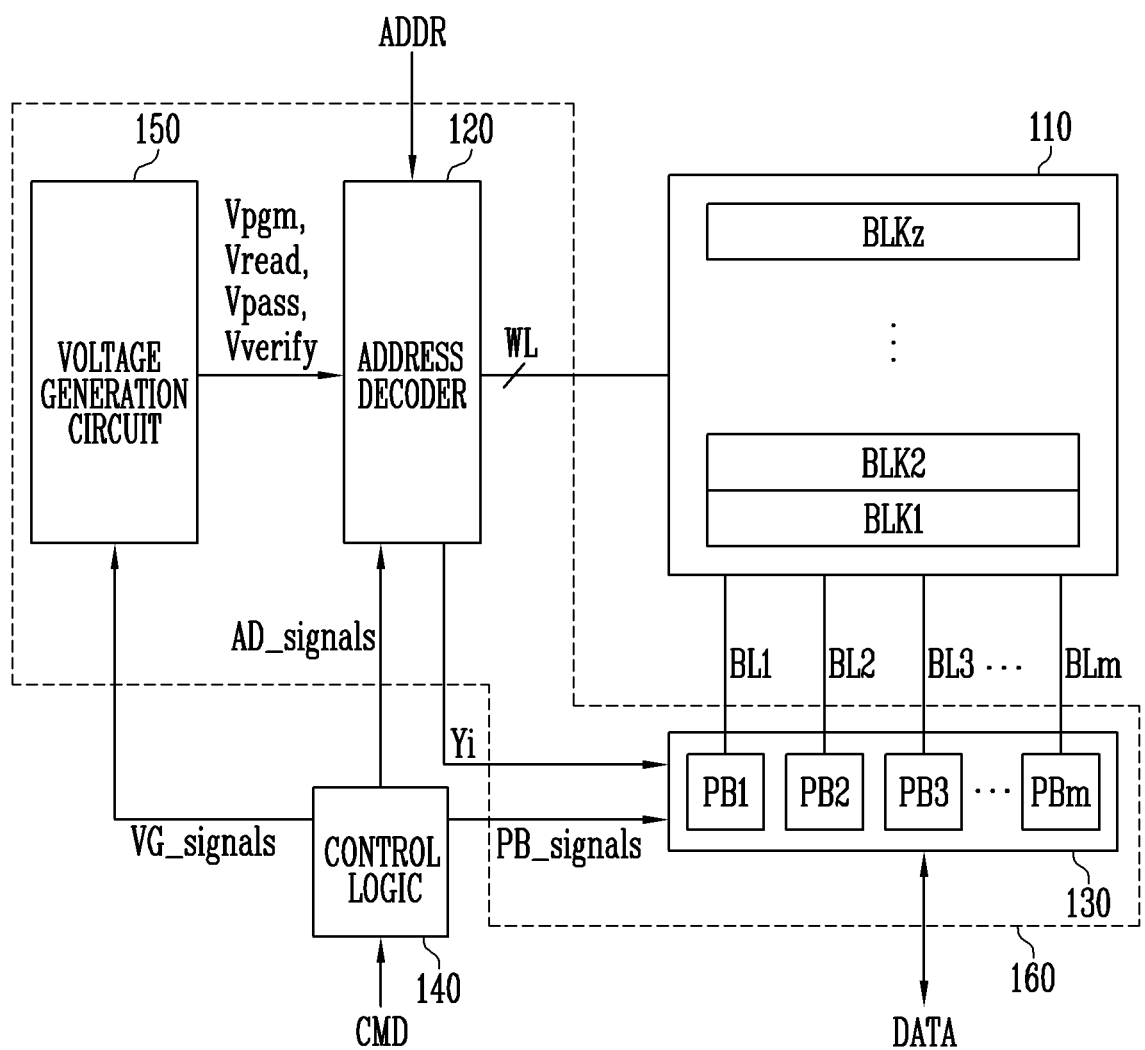
FIG. 2 is a diagram illustrating a semiconductor memory device included in a memory device, such as that of FIG. 1.

FIG. 2 is a diagram illustrating a semiconductor memory device (or a semiconductor memory) included in a memory device of FIG. 1.

Referring to FIG. 2, the semiconductor memory 100 may include a memory cell array 110, an address decoder 120, a read and write circuit 130, control logic 140, and a voltage generation circuit 150. The address decoder 120, the read and write circuit 130, and the voltage generation circuit 150 may function as a peripheral circuit 160 which performs a read operation on the memory cell array 110.

The memory cell array 110 includes a plurality of memory blocks BLK1 to BLKz. The memory blocks BLK1 to BLKz are coupled to the address decoder 120 through word lines WL. The memory blocks BLK1 to BLKz are coupled to the read and write circuit 130 through bit lines BL1 to BLm. Each of the memory blocks BLK1 to BLKz includes a plurality of memory cells. In an embodiment, the plurality of memory cells may be nonvolatile memory cells. Memory cells coupled to one word line, among the plurality of memory cells, may be defined as one page. The memory cell array 110 may be composed of a plurality of pages.

Each of the memory blocks BLK1 to BLKz of the memory cell array 110 includes a plurality of memory strings. Each of the memory strings may include a drain select transistor, a plurality of memory cells, and a source select transistor, which are coupled in series between a corresponding bit line and a source line. Further, each of the memory strings may include respective pass transistors between the source select transistor and the memory cells and between the drain select transistor and the memory cells, and may further include a pipe gate transistor between the memory cells. The memory cell array 110 is described in detail below.

The address decoder 120 is coupled to the memory cell array 110 through the word lines WL. The address decoder 120 may be operated in response to address decoder control signals AD_signals generated by the control logic 140. The address decoder 120 receives addresses ADD through an input/output buffer (not illustrated) provided in the semiconductor memory 100.

During a program operation, the address decoder 120 may decode a row address, among the received address ADDR, and may apply various operating voltages including a program voltage Vpgm, a read voltage Vread, a pass voltage Vpass, and a verify voltage Vverify, which are generated by the voltage generation circuit 150, to the plurality of memory cells of the memory cell array 110 depending on the decoded row address.

The address decoder 120 may decode a column address, among the received addresses ADDR. The address decoder 120 may transmit a decoded column address Yi to the read and write circuit 130.

The addresses ADDR received in a program operation or a read operation include a block address, a row address, and a column address. The address decoder 120 may select one memory block and one word line in accordance with the block address and the row address. The column address may be decoded by the address decoder 120 and may then be provided to the read and write circuit 130.

The address decoder 120 may include a block decoder, a row decoder, a column decoder, an address buffer, etc.

The read and write circuit 130 may include a plurality of page buffers PB1 to PBm. The plurality of page buffers PB1 to PBm are coupled to the memory cell array 110 through the bit lines BL1 to BLm. The plurality of page buffers PB1 to PBm may perform a data sensing operation of sensing the program states of memory cells coupled to the bit lines BL1 to BLm during a read operation or a verify operation. During the data sensing operation, the plurality of page buffers PB1 to PBm may latch data based on the amounts of current of the corresponding bit lines BL1 to BLm, respectively. The plurality of page buffers PB1 to PBm may perform a data transmission operation of receiving data to be programmed and temporarily storing the data during a program operation, and may control the potential levels of the corresponding bit lines BL1 to BLm based on the temporarily stored data.

Each of the plurality of page buffers PB1 to PBm may include a main latch component which latches data to be programmed during a data transmission operation and latches data during a data sensing operation. The main latch component latches data based on a first trip voltage during the data transmission operation and latches data based on a second trip voltage during the data sensing operation, wherein the first trip voltage and the second trip voltage have different potentials. For example, the first trip voltage may have a potential lower than that of the second trip voltage. The main latch component may latch first data (e.g., "0") or second data (e.g., "1") depending on whether the potential of the sensing node is higher or lower than the first trip voltage during the data transmission operation, and may latch first data (e.g., "0") or second data (e.g., "1") depending on whether the potential of the sensing node is higher than or lower than the second trip voltage during the data sensing operation.

The read and write circuit 130 may be operated in response to page buffer control signals PB_signals output from the control logic 140.

In an embodiment, the read and write circuit 130 may include page buffers (or page registers), a column select circuit, etc.

The control logic 140 may be coupled to the address decoder 120, the read and write circuit 130, and the voltage generation circuit 150. The control logic 140 may receive a command CMD through an input/output buffer (not illustrated) of the semiconductor memory 100. The control logic 140 may control overall operation of the semiconductor memory 100 in response to the command CMD. For example, the control logic 140 may receive the command CMD corresponding to the program operation, and may generate and output address decoder control signals AD_signals for controlling the address decoder 120, page buffer control signals PB_signals for controlling the read and write circuit 130, and voltage generation circuit control signals VG_signals for controlling the voltage generation circuit 150 in response to the received command CMD. Further, the control logic 140 may receive the command CMD corresponding to the read operation, and may generate and output address decoder control signals AD_signals for controlling the address decoder 120, page buffer control signals PB_signals for controlling the read and write circuit 130, and voltage generation circuit control signals VG_signals for controlling the voltage generation circuit 150 in response to the received command CMD.

During a program operation, the voltage generation circuit 150 may generate the program voltage Vpgm, the pass voltage Vpass, and the verify voltage Vverify under the control of the voltage generation circuit control signals VG_signals output from the control logic 140, and may output the generated voltages to the address decoder 120. Also, during a read operation, the voltage generation circuit 150 may generate the read voltage Vread and the pass voltage Vpass under the control of the voltage generation circuit control signals VG_signals output from the control logic 140, and may output the generated voltages to the address decoder 120.

Figure 3:
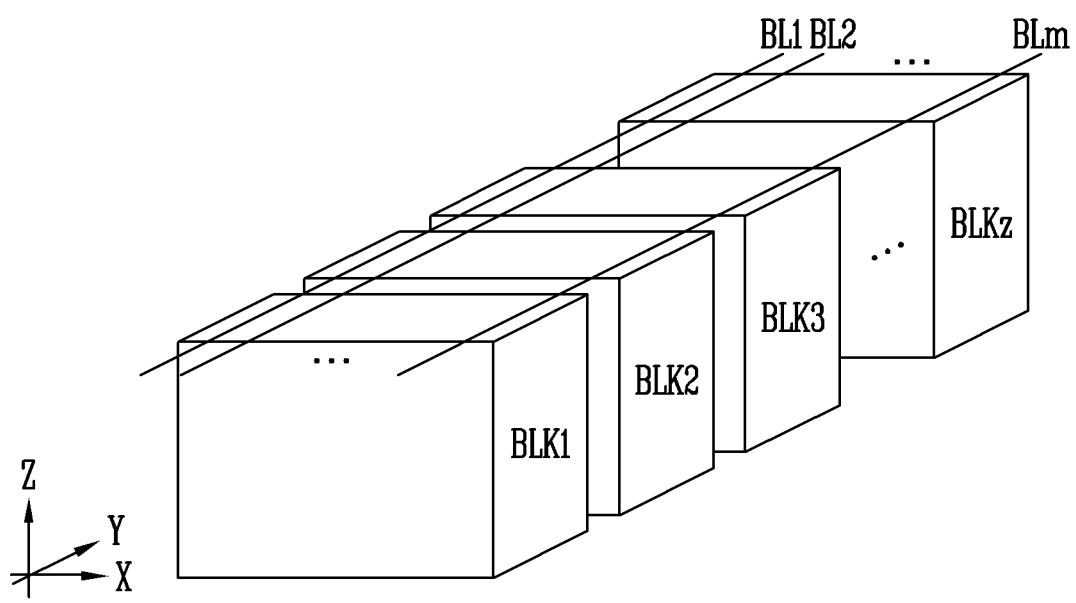
FIG. 3 is a diagram illustrating memory blocks having a 3D structure.

FIG. 3 is a diagram illustrating memory blocks having a 3D structure.

Referring to FIG. 3, the memory blocks BLK1 to BLKz having a 3D structure may be spaced apart from each other along direction Y in which bit lines BL1 to BLm extend. For example, the memory blocks BLK1 to BLKz may be spaced apart from each other along direction Y, and each such memory block may include a plurality of memory cells stacked along direction Z. The configuration of any one of memory blocks BLK1 to BLKz is described in detail below with reference to FIGS. 4 and 5.

Figure 4:
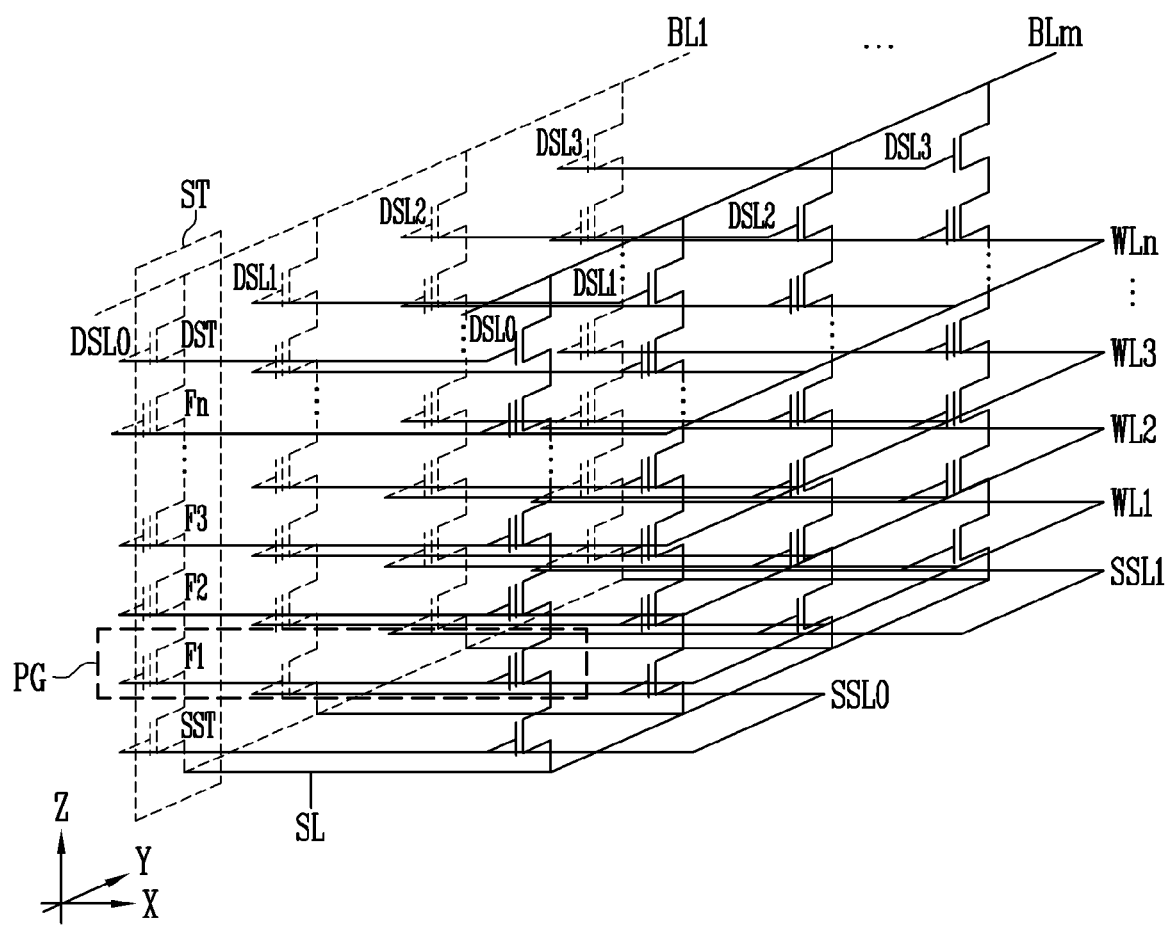
FIG. 4 is a circuit diagram illustrating in detail a representative one of the memory blocks illustrated in FIG. 3.

FIG. 4 is a circuit diagram illustrating in detail any one memory block illustrated in FIG. 3.

Figure 5:
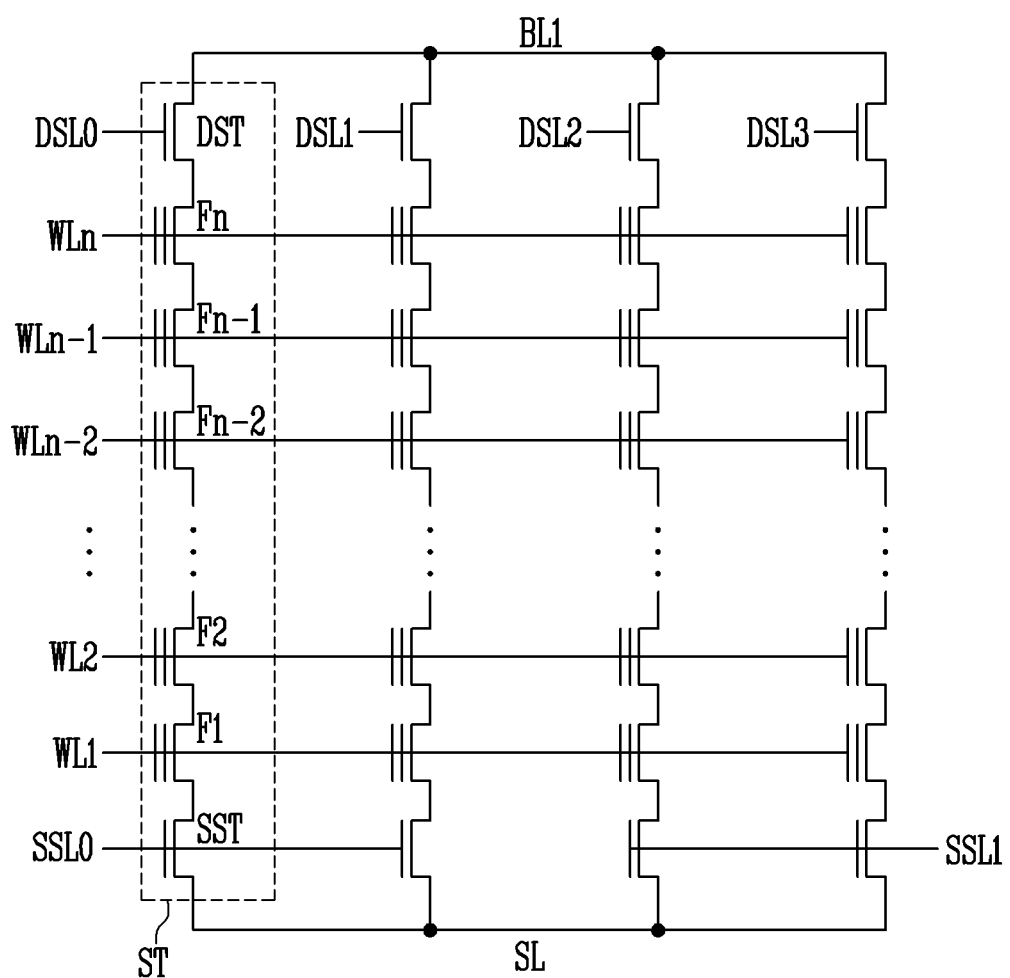
FIG. 5 is a circuit diagram illustrating memory strings of a memory block, such as that illustrated in FIG. 4.

FIG. 5 is a circuit diagram illustrating memory strings illustrated in FIG. 4.

Referring to FIGS. 4 and 5, respective memory strings ST may be coupled between bit lines BL1 to BLm and a source line SL. A memory string ST coupled between the first bit line BL1 and the source line SL is described by way of example.

The memory string ST may include a source select transistor SST, memory cells F1 to Fn (where n is a positive integer), and a drain select transistor DST which are coupled in series between the source line SL and the first bit line BL1. Gates of source select transistors SST included in different memory strings ST coupled to different bit lines BL1 to BLm may be coupled to a first source select line SSL0 and to a second source select line SSL1. For example, among the source select transistors SST, source select transistors that are adjacent to each other in direction Y may be coupled to the same source select line. For example, assuming that the source select transistors SST are sequentially arranged along direction Y, the gates of the source select transistors SST which are arranged from the first source select transistor SST in direction X and which are included in different memory strings ST, and the gates of source select transistors SST which are arranged from the second source select transistor SST in direction X and which are included in different memory strings ST may be coupled to the first source select line SSL0. Also, the gates of the source select transistors SST which are arranged from the third source select transistor SST in direction X and which are included in different memory strings ST, and the gates of source select transistors SST which are arranged from the fourth source select transistor SST in direction X and which are included in different memory strings ST may be coupled to the second source select line SSL1.

The gates of the memory cells F1 to Fn may be coupled to the word lines WL1 to WLn, and the gates of the drain select transistors DST may be coupled to any one of the first to fourth drain select lines DSL0 to DSL3.

The gates of the transistors arranged in direction X, among the drain select transistors DST, may be coupled in common to the same drain select line (e.g., DSL0), but the gates of the transistors arranged in direction Y may be coupled to different drain select lines DSL1 to DSL3. For example, assuming that drain select transistors DST are sequentially arranged along direction Y, the gates of the drain select transistors DST which are arranged from the first drain select transistor DST in direction X and which are included in different memory strings ST may be coupled to the first drain select line DSL0. The drain select transistors DST, arranged from the drain select transistors DST coupled to the first drain select line DSL0 in direction Y, may be sequentially coupled to the second to fourth drain select lines DSL1 to DSL3. Therefore, in the selected memory block, memory strings ST coupled to the selected drain select line may be selected, and memory strings ST coupled to the remaining drain select lines, that is, unselected drain select lines, may be unselected.

The memory cells coupled to the same word line may form one page PG. Here, the term "page" means a physical page. For example, among the memory strings ST coupled to the first bit line BL1 to the m-th bit line BLm, a group of memory cells coupled in direction X in the same word line is referred to as a page PG. For example, among the first memory cells F1 coupled to the first word line WL1, memory cells arranged in direction X may form one page PG. Among the first memory cells F1 coupled in common to the first word line WL1, memory cells arranged in direction Y may be divided into different pages. Therefore, when the first drain select line DSL0 is a selected drain select line and the first word line WL1 is a selected word line, a page coupled to the first drain select line DSL0, among a plurality of pages PG coupled to the first word line WL1, may be the selected page. The pages which are coupled in common to the word line WL1 but are coupled to unselected second to fourth drain select lines DSL1 to DSL3 may be unselected pages.

Although, in the drawings, one source select transistor SST and one drain select transistor DST are illustrated as being included in one memory string ST, a plurality of source select transistors SST and a plurality of drain select transistors DST may be included in one memory string ST depending on the semiconductor memory. Also, dummy cells may be included between the source select transistor SST, the memory cells F1 to Fn, and the drain select transistor DST depending on the semiconductor memory. The dummy cells do not store user data like the normal memory cells F1 to Fn, but may be used to improve the electrical characteristics of each memory string ST. However, since the dummy cells are optional components, detailed description thereof is omitted here.

Figure 6:
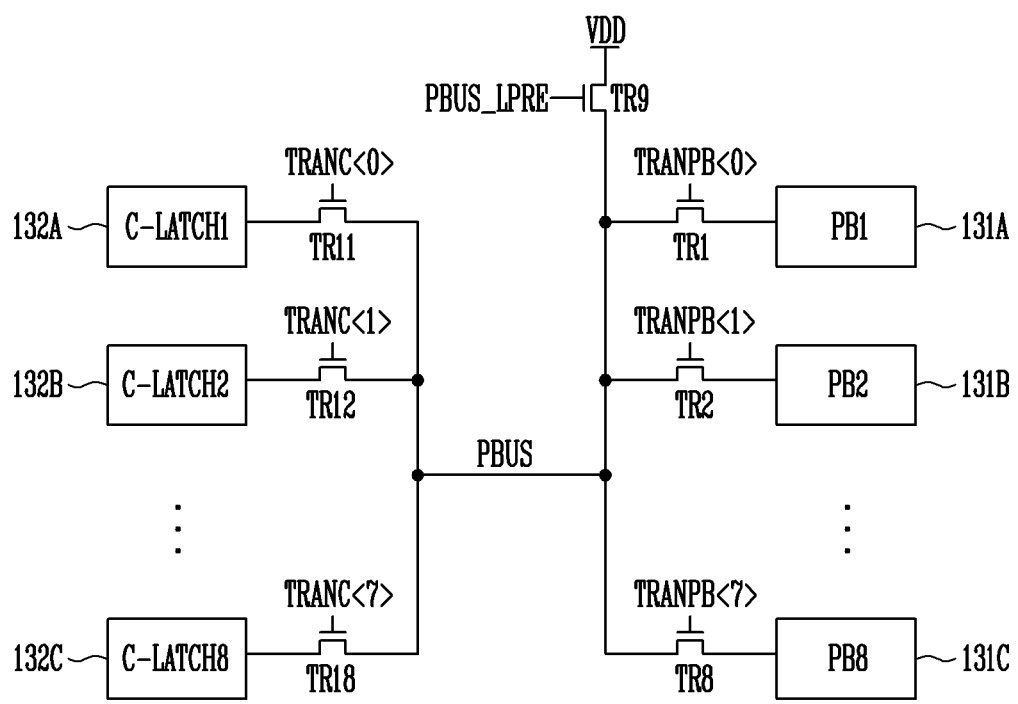
FIG. 6 is a diagram illustrating a read and write circuit, such as that of FIG. 2.

FIG. 6 is a diagram illustrating the read and write circuit of FIG. 2.

Referring to FIG. 6, the read and write circuit 130 may include a plurality of page buffers 131A to 131C, a plurality of cache latch components 132A to 132C, and a plurality of transistors TR1 to TR9 and TR11 to TR18. The plurality of cache latch components 132A to 132C may be coupled to input/output pads (not illustrated) of the semiconductor memory.

The plurality of page buffers 131A to 131C may correspond to the plurality of cache latch components 132A to 132C, respectively. For example, the page buffer PB1 may correspond to the cache latch component C-LATCH1, and the page buffer PB8 may correspond to the cache latch component C-LATCH8.

The plurality of transistors TR1 to TR8 may be coupled between respective page buffers 131A to 131C and a page buffer common node PBUS, and each of the transistors TR1 to TR8 may be operated in response to any one of page buffer transmission signals TRANPB<7:0>. For example, the transistor TR1 may be coupled between the page buffer PB1 and the page buffer common node PBUS. The transistor TR1 may transmit data stored in the page buffer PB1 to the page buffer common node PBUS or transmit data to the page buffer PB1 through the page buffer common node PBUS, in response to a page buffer transmission signal TRANPB<0>. Also, the transistor TR8 may be coupled between the page buffer PB8 and the page buffer common node PBUS. The transistor TR8 may transmit data stored in the page buffer PB8 to the page buffer common node PBUS or transmit data to the page buffer PB8 through the page buffer common node PBUS, in response to a page buffer transmission signal TRANPB<7>.

The transistor TR9 may be coupled between a supply voltage VDD and the page buffer common node PBUS, and may precharge the page buffer common node PBUS by applying the supply voltage VDD to the page buffer common node PBUS in response to a common node precharge signal PBUS_LPRE. Here, the supply voltage VDD may be applied to the page buffer common node PBUS only when the voltage level of the common node precharge signal PBUS_LPRE is equal to or greater than a voltage level 'VDD+Vth', which represents the sum of the threshold voltage Vth of the transistor TR9 and the supply voltage VDD.

The plurality of transistors TR11 to TR18 may be coupled between respective cache latch components 132A to 132C and the page buffer common node PBUS, and each of the plurality of transistors TR11 to TR18 may be operated in response to any one of cache latch transmission signals TRANC<7:0>. For example, the transistor TR11 may be coupled between the cache latch component C-LATCH1 and the page buffer common node PBUS. The transistor TR11 may transmit data stored in the cache latch component C-LATCH1 to the page buffer common node PBUS or transmit data to the cache latch component C-LATCH1 through the page buffer common node PBUS, in response to a cache latch transmission signal TRANC<0>. Further, the transistor TR18 may be coupled between the cache latch component C-LATCH8 and the page buffer common node PBUS. The transistor TR18 may transmit data stored in the cache latch component C-LATCH8 to the page buffer common node PBUS or transmit data to the cache latch component C-LATCH8 through the page buffer common node PBUS, in response to a cache latch transmission signal TRANC<7>.

As described above, the plurality of page buffers 131A to 131C and the plurality of cache latch components 132A to 132C may be coupled to the page buffer common node PBUS of the read and write circuit 130. In order to transmit data stored in the plurality of page buffers 131A to 131C to the plurality of cache latch components 132A to 132C, or transmit data stored in the plurality of cache latch components 132A to 132C to the plurality of page buffers 131A to 131C, the page buffer common node PBUS is precharged to a set level using the transistor TR9.

The plurality of page buffers 131A to 131C and the plurality of cache latch components 132A to 132C may be arranged to be spaced apart from each other in a layout by a set distance, and may be coupled to each other through one page buffer common node PBUS, and thus the page buffer common node PBUS may have a relatively large wiring load. Due thereto, current consumption may be increased during the precharge and discharge operations of the page buffer common node PBUS. In order to reduce current consumption during the precharge and discharge operations of the page buffer common node PBUS, a low precharge scheme for precharging the page buffer common node PBUS in which the precharge level of the page buffer common node PBUS is lower than that of the supply voltage VDD may be used. Here, the supply voltage VDD may be applied to the page buffer common node PBUS only when the voltage level of the common node precharge signal PBUS_LPRE is equal to or greater than a voltage level 'VDD+Vth' representing the sum of the threshold voltage Vth of the transistor TR9 and the supply voltage VDD. When the plurality of page buffers 131A to 131C receive and latch data stored in the plurality of cache latch components 132A to 132C through the page buffer common node PBUS, the data should be latched using a relatively low trip voltage.

Figure 7:
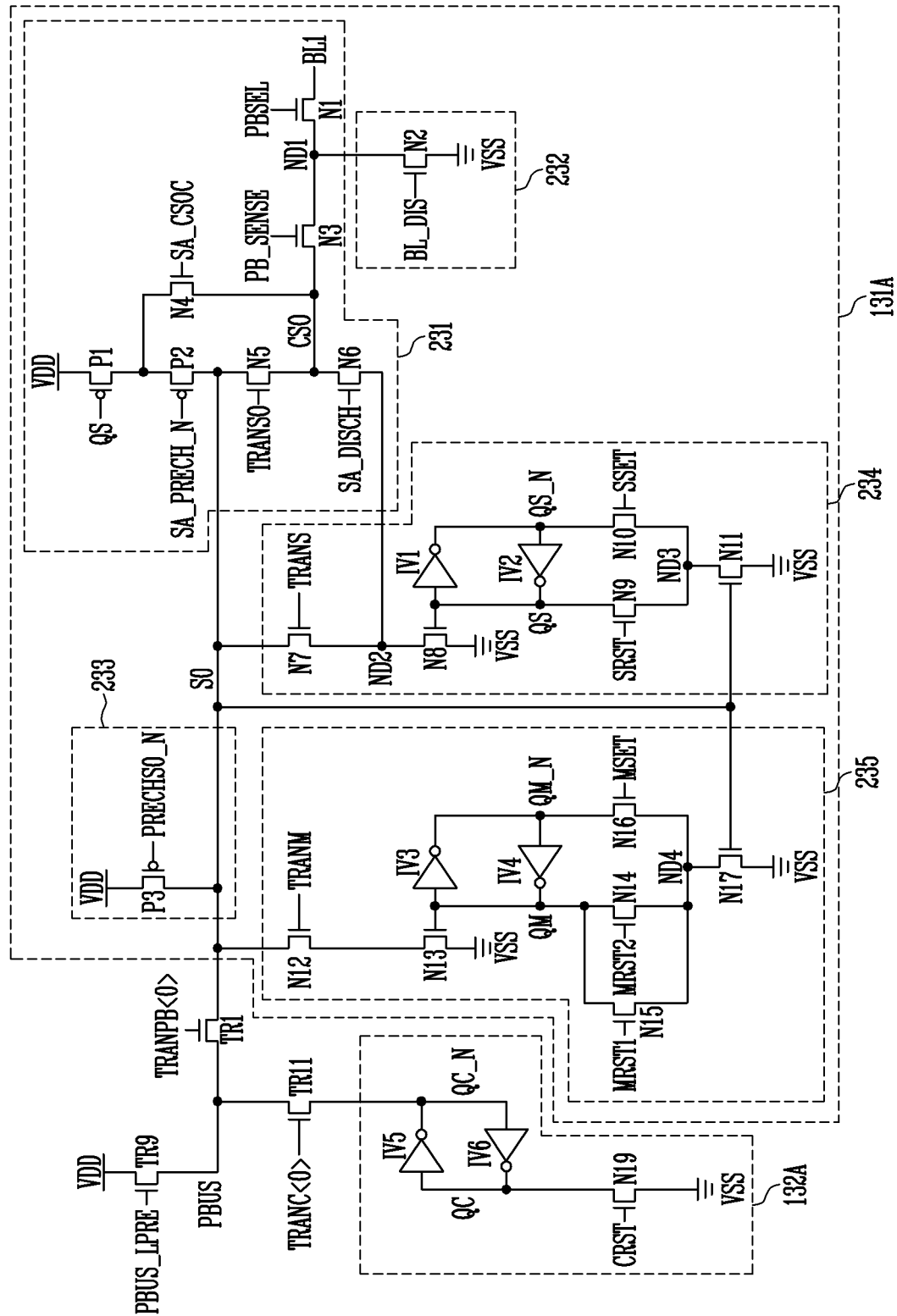
FIG. 7 is a circuit diagram illustrating a cache latch component and a page buffer, such as those of FIG. 6.

FIG. 7 is a circuit diagram illustrating the cache latch component and the page buffer of FIG. 6.

Each of the plurality of page buffers 131A to 131C of FIG. 6 may have a similar structure, and each of the plurality of cache latch components 132A to 132C may have a similar structure. Accordingly, the page buffer 131A and the cache latch component 132A are described by way of example.

Referring to FIG. 7, the page buffer 131A may include a bit line controller 231, a bit line discharger 232, a sensing node precharger 233, a sub-latch component 234, and a main latch component 235.

The bit line controller 231 may control the potential level of a sensing node SO based on the amount of current of a bit line BL1 that changes depending on the program state of a memory cell coupled to the bit line BL1 during a data sensing operation of a read operation or a verify operation.

The bit line controller 231 may include a plurality of NMOS transistors N1 and N3 to N6 and a plurality of PMOS transistors P1 and P2.

The NMOS transistor N1 may be coupled between the bit line BL1 and a node ND1 and may electrically couple the bit line BL1 to the node ND1 in response to a page buffer select signal PBSEL.

The NMOS transistor N3 may be coupled between the node ND1 and a common node CSO and may electrically couple the node ND1 to the common node CSO in response to a page buffer sensing signal PB_SENSE.

The PMOS transistor P1 and the PMOS transistor P2 may be coupled in series between a supply voltage VDD and a sensing node SO, and may be turned on in response to a signal at a node QS of the sub-latch component 234 and a precharge signal SA_PRECH_N, respectively.

The NMOS transistor N4 may be coupled between a node between the PMOS transistor P1 and the PMOS transistor P2 and the common node CSO, and may provide the supply voltage VDD, provided through the PMOS transistor P1, to the common node CSO in response to a control signal SA_CSOC.

The NMOS transistor N5 may be coupled between the sensing node SO and the common node CSO and may electrically couple the sensing node SO to the common node CSO in response to a transmission signal TRANSO.

The NMOS transistor N6 may be coupled between the common node CSO and a node ND2 of the sub-latch component 234 and may electrically couple the common node CSO to the node ND2 in response to a discharge signal SA_DISCH.

The operation of the bit line controller 231 during a data sensing operation is described below.

The PMOS transistor P1 and the PMOS transistor P2 may precharge the sensing node SO to the level of the supply voltage VDD in response to both the signal at the node QS of the sub-latch component 234 and the precharge signal SA_PRECH_N being at a logic low level. The NMOS transistor N5 may be turned on in response to the transmission signal TRANSO at a logic high level, and the common node CSO may be precharged to a level 'VDD−Vth'.

Thereafter, during an interval from when the precharge signal SA_PRECH_N makes a transition to a logic high level to when the transmission signal TRANSO makes a transition to a logic low level, an evaluation operation may be performed. The PMOS transistor P2 may be turned off in response to the precharge signal SA_PRECH_N which has made a transition to a logic high level, thus interrupting the supply voltage VDD applied to the sensing node SO. The potential levels of the sensing node SO and the common node CSO may change depending on the program state of the memory cell coupled to the bit line BL1. For example, when the memory cell is in a program state in which the threshold voltage of the memory cell is higher than a read voltage or a verify voltage applied to the word line of the memory cell during a read or verify operation, current does not flow through the bit line BL1. Accordingly, the potentials of the common node CSO and the sensing node SO may be maintained at the precharge level. In contrast, when the memory cell is in an erased state in which the threshold voltage of the memory cell is lower than the read voltage or the verify voltage applied to the word line of the memory cell during the read or verify operation, current flows through the bit line BL1. Accordingly, the potentials of the common node CSO and the sensing node SO may be decreased to the discharge level VSA_CSOC−Vth from the precharged level.

The bit line discharger 232 may be coupled to the node ND1 of the bit line controller 231 to discharge the potential level of the bit line BL1.

The bit line discharger 232 may include an NMOS transistor N2 coupled between the node ND1 and a ground power source VSS, and the NMOS transistor N2 may apply the ground power VSS to the node ND1 in response to a bit line discharge signal BL_DIS.

The sensing node precharger 233 may be coupled between the sensing node SO and the supply voltage VDD to precharge the sensing node SO to the level of the supply voltage VDD.

The sensing node precharger 233 may include a PMOS transistor P3, and the PMOS transistor P3 may apply the supply voltage VDD to the sensing node SO in response to a sensing node precharge signal PRECHSO_N.

The sub-latch component 234 may include a plurality of NMOS transistors N7 to N11 and inverters IV1 and IV2.

The inverters IV1 and IV2 may be coupled in parallel in opposite directions between the node QS and a node QS_N, thus forming a latch.

The NMOS transistor N7 and the NMOS transistor N8 may be coupled in series between the sensing node SO and the ground power source VSS, wherein the NMOS transistor N7 is turned on in response to the transmission signal TRANS and the NMOS transistor N8 is turned on or off depending on the potential level of the node QS.

The NMOS transistor N9 may be coupled between the node QS and the node ND3 and may then electrically couple the node QS to the node ND3 in response to a reset signal SRST. The NMOS transistor N10 may be coupled between the node QS_N and the node ND3 and may then electrically couple the node QS_N to the node ND3 in response to a set signal SSET. The NMOS transistor N11 may be coupled between the node ND3 and the ground power source VSS, and may be turned on depending on the potential of the sensing node SO to electrically couple the node ND3 to the ground power source VSS. For example, when the reset signal SRST of a logic high level is applied to the NMOS transistor N9 in the state in which the sensing node SO is precharged to a high level, the node QS and the node QS_N may be initialized to a logic low level and a logic high level, respectively. Further, when the set signal SSET of a logic high level is applied to the NMOS transistor N10 in the state in which the sensing node SO is precharged to a logic high level, the node QS and the node QS_N may be set to a logic high level and a logic low level, respectively. During a data sensing operation, the node QS may be set to a logic low level.

The main latch component 235 may include a plurality of NMOS transistors N12 to N17 and inverters IV3 and IV4.

The inverters IV3 and IV4 may be coupled in parallel in opposite directions between a node QM and a node QM_N, thus forming a latch.

The NMOS transistor N12 and the NMOS transistor N13 may be coupled in series between the sensing node SO and the ground power source VSS, wherein the NMOS transistor N12 is turned on in response to a transmission signal TRANM and the NMOS transistor N13 is turned on or off depending on the potential level of the node QM.

The NMOS transistor N14 and the NMOS transistor N15 may be coupled in parallel between the node QM and an ND4, wherein the NMOS transistor N15 is turned on or off in response to a first reset signal MRST1 and the NMOS transistor N14 is turned on or off in response to a second reset signal MRST2. The NMOS transistor N16 may be coupled between the node QM_N and the node ND4 and may then electrically couple the node QM_N to the node ND4 in response to a set signal MSET. The NMOS transistor N17 may be coupled between the node ND4 and the ground power source VSS and may couple the node ND4 to the ground power source VSS depending on the potential of the sensing node SO.

The size of the NMOS transistor N15 may be larger than that of the NMOS transistor N16. That is, the NMOS transistor N15 may be designed to have a lower turn-on resistance than that of the NMOS transistor N16. Also, a pull-down current path (e.g., a first current path) between the node QM and the node ND4, which is formed when the NMOS transistor N14 and the NMOS transistor N15 are simultaneously turned on, has a lower resistance than that of a pull-down current path (e.g., a second current path) between the node QM and the node ND4, which is formed when only one transistor, that is, the NMOS transistor N15 or the NMOS transistor N14, is turned on.

The main latch component 235 may latch data based on the potential level of the sensing node SO during a data transmission operation and a data sensing operation. For example, during the data transmission operation, the NMOS transistor N17 may be turned on or off based on the potential level of the sensing node SO, and the NMOS transistor N15 and the NMOS transistor N14 may form the first current path in response to the first reset signal MRST1 and the second reset signal MRST2. Further, during the data sensing operation, the NMOS transistor N17 may be turned on or off based on the potential level of the sensing node SO, and only the NMOS transistor N15 of the NMOS transistors N14 and N15 may be turned on in response to the first reset signal MRST1 to form the second current path. Due thereto, the potential level of the node QM may be controlled to a logic low level or a logic high level depending on the potential level of the sensing node SO, and thus data may be latched.

The cache latch component 132A may include an NMOS transistor N19 and inverters IV5 and IV6.

The inverters IV5 and IV6 may be coupled in parallel in opposite directions between a node QC and a node QC_N, thus forming a latch. The NMOS transistor N19 may be coupled between the node QC and the ground power source VSS and may be turned on in response to the reset signal CRST.

During a data transmission operation of transmitting the data stored in the cache latch component 132A to the main latch component 235 of the page buffer 131A, a page buffer common node PBUS may be precharged to a level lower than that of the supply voltage VDD by the transistor TR9. Due thereto, the sensing node SO of the page buffer 131A may be precharged to the level of the supply voltage VDD, but the potential level of the sensing node SO may be discharged to a ground level or may be decreased to the same level as the precharge level of the page buffer common node PBUS, depending on the data transmitted from the cache latch component 132A during the data transmission operation.

In contrast, during a data sensing operation of sensing the state of the memory cell coupled to the bit line BL1, the sensing node SO may be maintained at the level of the supply voltage VDD, that is, the precharged level, or may be discharged to a discharge level VSA_CSOC−Vth.

Accordingly, the main latch component 235 may use a relatively low trip voltage during the data transmission operation, and may use a relatively high trip voltage during the data sensing operation, thus improving the accuracy of the data latch operation.

In an embodiment of the present disclosure, the main latch component 235 may include at least two NMOS transistors N14 and N15 coupled in parallel between the node QM and the node ND4, may turn on the at least two NMOS transistors N14 and N15 in order to relatively reduce the resistance of the pull-down current path between the node QM and the node ND4 during the data transmission operation, and may turn on only one of the at least two NMOS transistors N14 and N15 in order to relatively increase the resistance of the pull-down current path between the node QM and the node ND4 during the data sensing operation. That is, the main latch component 235 may set a first trip voltage having a relatively low potential by strengthening the pull-down current path of the node QM during the data transmission operation, and may set a second trip voltage having a relatively high potential by weakening the pull-down current path of the node QM during the data sensing operation.

Therefore, the main latch component 235 may perform a data latch operation using the relatively low first trip voltage during the data transmission operation, and may perform a data latch operation using the relatively high second trip voltage during the data sensing operation.

Figure 8:
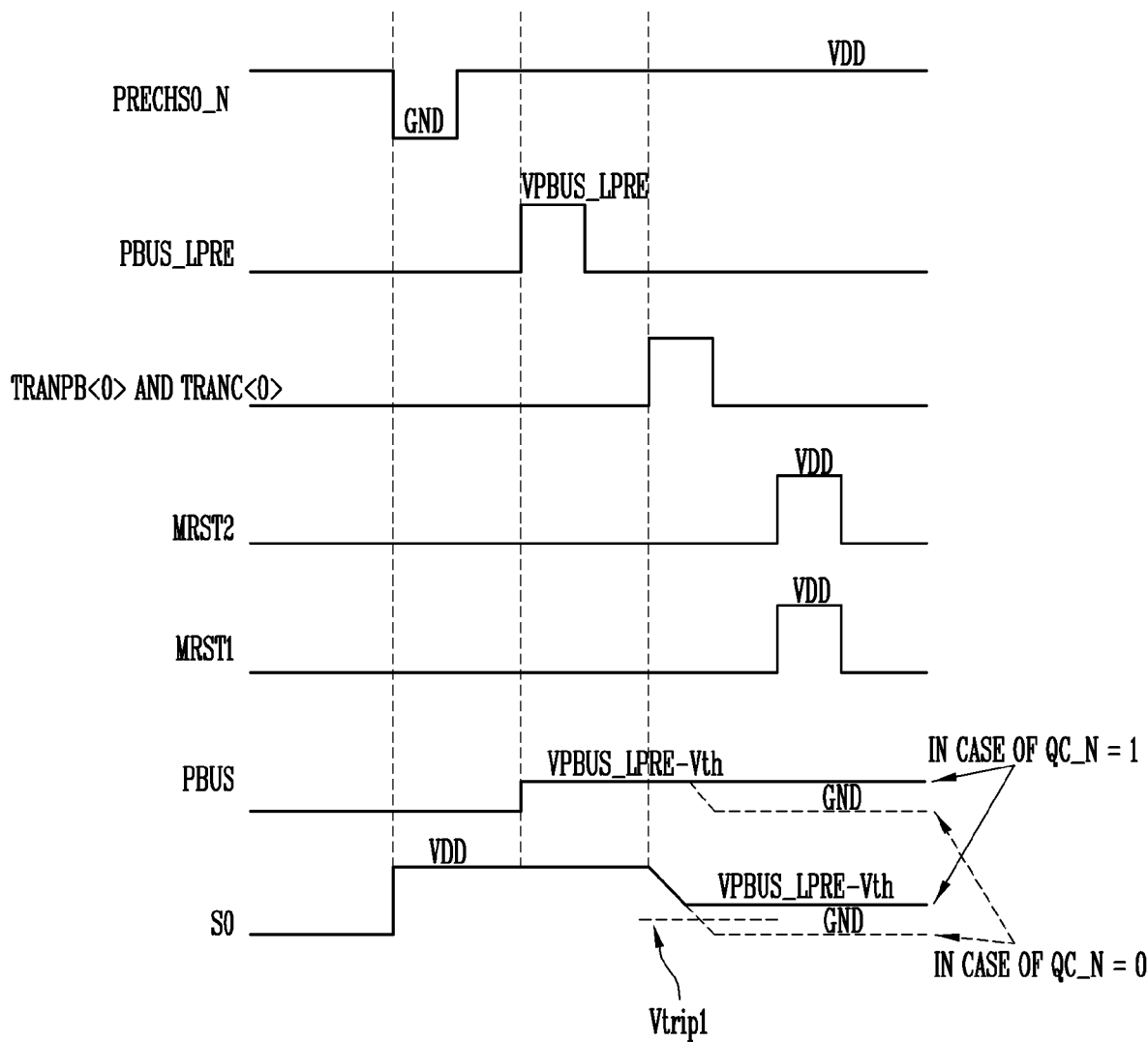
FIG. 8 is a waveform diagram of signals illustrating a data transmission operation between a cache latch component and a page buffer, such as those of FIG. 7.

FIG. 8 is a waveform diagram of signals illustrating a data transmission operation between the cache latch component and the page buffer of FIG. 7.

A data transmission operation between the cache latch component 132A and the page buffer 131A is described below with reference to FIGS. 7 and 8.

The sensing node precharger 233 may apply the supply voltage VDD to the sensing node SO in response to the sensing node precharge signal PRECHSO_N at a logic low level (ground: GND) during a set period of time. Due thereto, the sensing node SO is precharged to the level of the supply voltage VDD. After a set period of time has elapsed, the sensing node precharge signal PRECHSO_N makes a transition to a logic high level VDD, and then the PMOS transistor P3 is turned off.

The transistor TR9 applies the supply voltage VDD to the page buffer common node PBUS in response to the common node precharge signal PBUS_LPRE at a low precharge level VPBUS_LPRE for a set period of time. Accordingly, the page buffer common node PBUS may be precharged to a first level VPBUS_LPRE−Vth. The first level VPBUS_LPRE−Vth is lower than the level VDD to which the sensing node SO is precharged.

The transistor TR11 is turned on in response to a cache latch transmission signal TRANC<0>, and the transistor TR1 is turned on in response to a page buffer transmission signal TRANPB<0>. Due thereto, the page buffer common node PBUS is electrically coupled to the sensing node SO, so that the page buffer common node PBUS is maintained at the first level VPBUS_LPRE−Vth or is discharged to the logic low level GND depending on the data stored in the cache latch component 132A, and the sensing node SO is decreased to the first level VPBUS_LPRE−Vth, which is the precharge level of the page buffer common node PBUS, or is discharged to the logic low level GND. For example, when the node QC_N of the cache latch component 132A is at a logic low level (QC_N=0), the page buffer common node PBUS and the sensing node SO may be discharged to the logic low level GND. When the node QC_N of the cache latch component 132A is at a logic high level (QC_N=1), the potential of each of the page buffer common node PBUS and the sensing node SO may be the first level VPBUS_LPRE−Vth.

The NMOS transistor N17 of the main latch component 235 may be turned on or off depending on the potential level of the sensing node SO, and the NMOS transistor N15 and the NMOS transistor N14 may be turned on in response to the first reset signal MRST1 and the second reset signal MRST2 to form a first current path. Due thereto, the first trip voltage Vtrip1 of the main latch component 235 is set to a potential between the logic low level GND and the first level VPBUS_LPRE−Vth, and the main latch component 235 may latch first data (e.g., "0") and second data (e.g., "1") based on the potential levels of the set first trip voltage Vtrip1 and the potential level of the sensing node SO.

Figure 9:
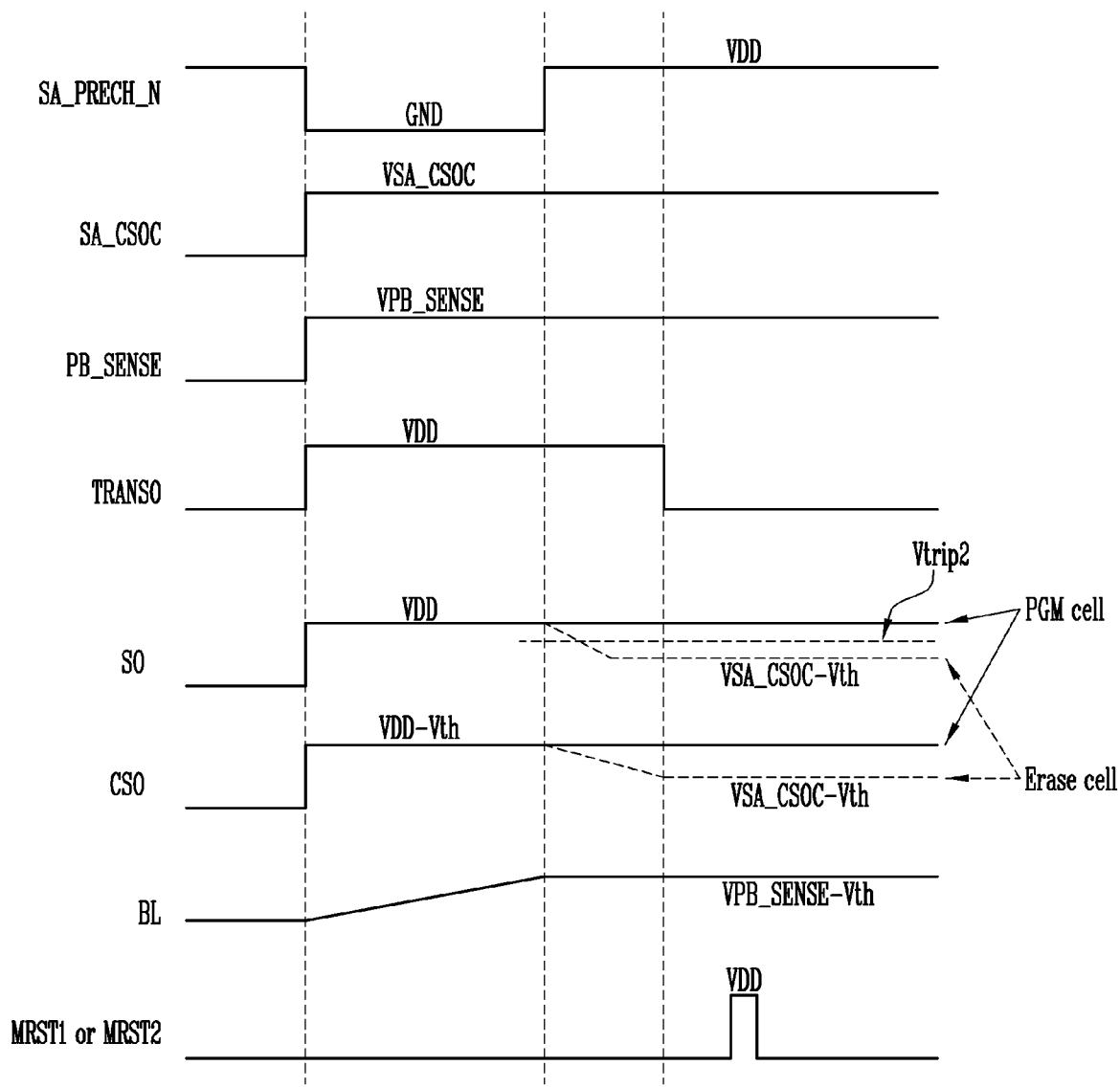
FIG. 9 is a waveform diagram of signals illustrating a data sensing operation of a page buffer, such as that of FIG. 7.

FIG. 9 is a waveform diagram of signals illustrating the data sensing operation of the page buffer of FIG. 7.

A data sensing operation of the page buffer 131A is described below with reference to FIGS. 7 and 9.

The PMOS transistor P1 and the PMOS transistor P2 may precharge the sensing node SO to the level of the supply voltage VDD in response to both the signal at the node QS of the sub-latch component 234 and the precharge signal SA_PRECH_N being at a logic low level. The NMOS transistor N5 may be turned on in response to the transmission signal TRANSO at a logic high level, and the common node CSO may be precharged to a level 'VDD−Vth'. The NMOS transistor N3 may be turned on in response to the page buffer sensing signal PB_SENSE at a logic high level VPB_SENSE. The NMOS transistor N1 may be turned on in response to the page buffer select signal PBSEL and may then precharge the bit line BL1 to the precharge level VPB_SENSE−Vth by supplying current to the bit line BL1.

Thereafter, when the precharge signal SA_PRECH_N makes a transition to a logic high level VDD, the PMOS transistor P2 is turned off in response to the precharge signal SA_PRECH_N having made a transition to a logic high level, and thus the application of the supply voltage VDD to the sensing node SO is interrupted. The potential levels of the sensing node SO and the common node CSO may change depending on the program state of the memory cell coupled to the bit line BL1. For example, when the memory cell is in a program state (PGM Cell) in which the threshold voltage of the memory cell is higher than a read voltage or a verify voltage applied to the word line of the memory cell during a read or verify operation, current does not flow through the bit line BL1. Accordingly, the potentials of the common node CSO and the sensing node SO may be maintained at the precharged level. In contrast, when the memory cell is in an erased state (Erase Cell) in which the threshold voltage of the memory cell is lower than the read voltage or the verify voltage applied to the word line of the memory cell during the read or verify operation, current flows through the bit line BL1. Accordingly, the potentials of the common node CSO and the sensing node SO may be decreased to the second level VSA_CSOC−Vth from the precharged level.

The NMOS transistor N17 of the main latch component 235 may be turned on or off depending on the potential level of the sensing node SO, and one of the NMOS transistor N15 and the NMOS transistor N14 may be turned on in response to the first reset signal RST1 or the second reset signal MRST2 to form a second current path. Due thereto, the second trip voltage Vtrip2 of the main latch component 235 may be set to a value between the supply voltage level VDD, which is the precharge level of the sensing node SO, and the second level VSA_CSOC−Vth, which is the discharge level. The main latch component 235 may latch first data (e.g., "0") and second data (e.g., "1") based on the potential level of the set second trip voltage Vtrip2 and the potential level of the sensing node SO.

Figure 10:
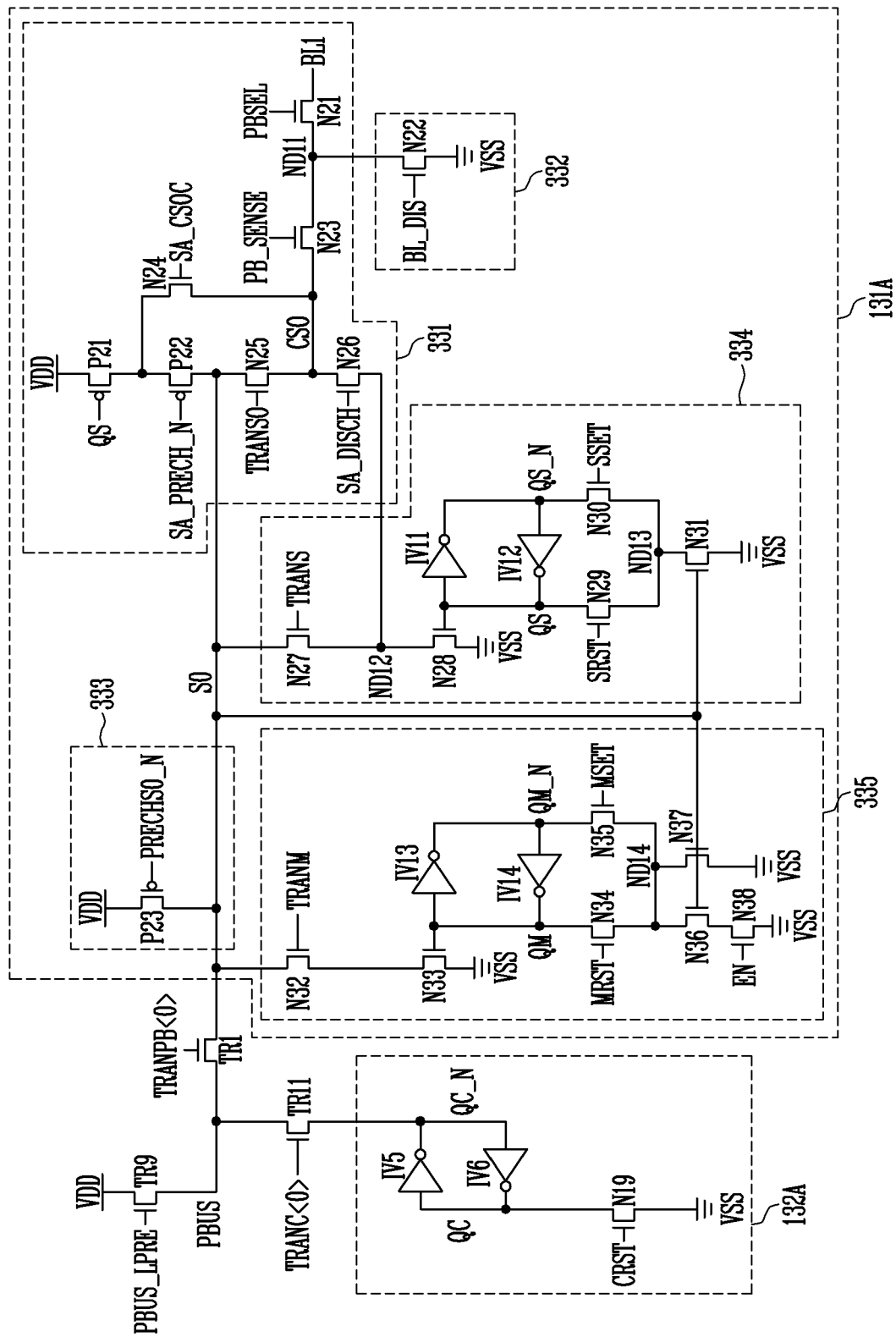
FIG. 10 is a circuit diagram illustrating a page buffer according to an embodiment of the present disclosure.

FIG. 10 is a circuit diagram illustrating a page buffer according to an embodiment of the present disclosure.

Referring to FIG. 10, the page buffer 131A may include a bit line controller 331, a bit line discharger 332, a sensing node precharger 333, a sub-latch component 334, and a main latch component 335.

The bit line controller 331 may control the potential level of a sensing node SO based on the amount of current of a bit line BL1 that changes depending on the program state of a memory cell coupled to the bit line BL1 during a data sensing operation of a read operation or a verify operation.

The bit line controller 331 may include a plurality of NMOS transistors N21 and N23 to N26 and a plurality of PMOS transistors P21 and P22.

The NMOS transistor N21 may be coupled between the bit line BL1 and a node ND11 and may electrically couple the bit line BL1 to the nod e ND1 in response to a page buffer select signal PBSEL.

The NMOS transistor N23 may be coupled between the node ND11 and a common node CSO and may electrically couple the node ND11 to the common node CSO in response to a page buffer sensing signal PB_SENSE.

The PMOS transistor P21 and the PMOS transistor P22 may be coupled in series between a supply voltage VDD and a sensing node SO, and may be turned on in response to a signal at a node QS of the sub-latch component 334 and a precharge signal SA_PRECH_N, respectively.

The NMOS transistor N24 may be coupled between a node between the PMOS transistor P21 and the PMOS transistor P22 and the common node CSO, and may provide the supply voltage VDD, provided through the PMOS transistor P21, to the common node CSO in response to a control signal SA_CSOC.

The NMOS transistor N25 may be coupled between the sensing node SO and the common node CSO and may electrically couple the sensing node SO to the common node CSO in response to a transmission signal TRANSO.

The NMOS transistor N26 may be coupled between the common node CSO and a node ND12 of the sub-latch component 334 and may electrically couple the common node CSO to the node ND12 in response to a discharge signal SA_DISCH.

The operation of the bit line controller 331 during a data sensing operation is described below.

The PMOS transistor P21 and the PMOS transistor P22 may precharge the sensing node SO to the level of the supply voltage VDD in response to both the signal at the node QS of the sub-latch component 334 and the precharge signal SA_PRECH_N being at a logic low level. The NMOS transistor N25 may be turned on in response to the transmission signal TRANSO of a logic high level, and the common node CSO may be precharged to a level 'VDD−Vth'.

Thereafter, during an interval from when the precharge signal SA_PRECH_N makes a transition to a logic high level to when the transmission signal TRANSO makes a transition to a logic low level, an evaluation operation may be performed. The PMOS transistor P22 may be turned off in response to the precharge signal SA_PRECH_N which has made a transition to a logic high level, thus interrupting the supply voltage VDD applied to the sensing node SO. The potential levels of the sensing node SO and the common node CSO may change depending on the program state of the memory cell coupled to the bit line BL1. For example, when the memory cell is in a program state in which the threshold voltage of the memory cell is higher than a read voltage or a verify voltage applied to the word line of the memory cell during a read or verify operation, current does not flow through the bit line BL1. Accordingly, the potentials of the common node CSO and the sensing node SO may be maintained at the precharge level. In contrast, when the memory cell is in an erased state in which the threshold voltage of the memory cell is lower than the read voltage or the verify voltage applied to the word line of the memory cell during the read or verify operation, current flows through the bit line BL1. Accordingly, the potentials of the common node CSO and the sensing node SO may be decreased to the discharge level VSA_CSOC−Vth from the precharged level.

The bit line discharger 332 may be coupled to the node ND11 of the bit line controller 331 to discharge the potential level of the bit line BL1.

The bit line discharger 332 may include an NMOS transistor N22 coupled between the node ND11 and a ground power source VSS, and the NMOS transistor N22 may apply the ground power VSS to the node ND11 in response to a bit line discharge signal BL_DIS.

The sensing node precharger 333 may be coupled between the sensing node SO and the supply voltage VDD to precharge the sensing node SO to the level of the supply voltage VDD.

The sensing node precharger 333 may include a PMOS transistor P23, and the PMOS transistor P23 may apply the supply voltage VDD to the sensing node SO in response to a sensing node precharge signal PRECHSO_N.

The sub-latch component 334 may include a plurality of NMOS transistors N27 to N31 and inverters IV11 and IV12.

The inverters IV11 and IV12 may be coupled in parallel in opposite directions between the node QS and a node QS_N, thus forming a latch.

The NMOS transistor N27 and the NMOS transistor N28 may be coupled in series between the sensing node SO and the ground power source VSS, wherein the NMOS transistor N27 is turned on in response to the transmission signal TRANS and the NMOS transistor N28 is turned on or off depending on the potential level of the node QS.

The NMOS transistor N29 may be coupled between the node QS and the node ND13 and may then electrically couple the node QS to the node ND13 in response to a reset signal SRST. The NMOS transistor N30 may be coupled between the node QS_N and the node ND13 and may then electrically couple the node QS_N to the node ND13 in response to a set signal SSET. The NMOS transistor N31 may be coupled between the node ND13 and the ground power source VSS, and may be turned on depending on the potential of the sensing node SO to electrically couple the node ND13 to the ground power source VSS. For example, when the reset signal SRST of a logic high level is applied to the NMOS transistor N29 in the state in which the sensing node SO is precharged to a high level, the node QS and the node QS_N may be initialized to a logic low level and a logic high level, respectively. Further, when the set signal SSET of a logic high level is applied to the NMOS transistor N30 in the state in which the sensing node SO is precharged to a logic high level, the node QS and the node QS_N may be set to a logic high level and a logic low level, respectively. During a data sensing operation, the node QS may be set to a logic low level.

The main latch component 335 may include a plurality of NMOS transistors N32 to N38 and inverters IV13 and IV14.

The inverters IV13 and IV14 may be coupled in parallel in opposite directions between a node QM and a node QM_N, thus forming a latch.

The NMOS transistor N32 and the NMOS transistor N33 may be coupled in series between the sensing node SO and the ground power source VSS, wherein the NMOS transistor N32 is turned on in response to a transmission signal TRANM and the NMOS transistor N33 is turned on or off depending on the potential level of the node QM.

The NMOS transistor N34 may be coupled between the node QM and the node ND14 and may then electrically couple the node QM to the node ND14 in response to a reset signal MRST. The NMOS transistor N35 may be coupled between the node QM_N and the node ND14 and may then electrically couple the node QM_N to the node ND14 in response to a set signal MSET.

The NMOS transistor N36 and the NMOS transistor N38 may be coupled in series between the node ND14 and the ground power source VSS. The NMOS transistor N36 may be turned on or off depending on the potential of the sensing node SO, and the NMOS transistor N38 may be turned on or off in response to an enable signal EN. The NMOS transistor N37 may be coupled between the node ND14 and the ground power source VSS, and may be turned on or off depending on the potential of the sensing node SO. That is, the NMOS transistor N36 and the NMOS transistor N38 which are coupled in series may form a structure that is coupled in parallel to the NMOS transistor N37. A pull-down current path (e.g., a first current path), which is formed between the node ND14 and the ground power source VSS when the NMOS transistor N36, the NMOS transistor N37, and the NMOS transistor N38 are simultaneously turned on, has a resistance value less than that of a pull-down current path (e.g., a second current path), which is formed through only one transistor, that is, the NMOS transistor N37.

The main latch component 335 may latch data based on the potential level of the sensing node SO during a data transmission operation and a data sensing operation. For example, during the data transmission operation, the NMOS transistor N38 is turned on in response to the enable signal EN at a logic high level and the NMOS transistor N36 and the NMOS transistor N37 are turned on or off based on the potential level of the sensing node SO, so that the main latch component 335 may or may not form the first current path, and may then latch data. Further, during the data sensing operation, the NMOS transistor N38 is turned off in response to the enable signal EN at a logic low level and the NMOS transistor N36 and the NMOS transistor N37 are turned on or off based on the potential level of the sensing node SO, so that the main latch component 335 may or may not form the second current path, and may then latch data.

Since the structure of the catch latch component 132A is identical to that of the cache latch component described with reference to FIG. 7, detailed description thereof is omitted here.

During a data transmission operation of transmitting the data stored in the cache latch component 132A to the main latch component 335 of the page buffer 131A, a page buffer common node PBUS may be precharged to a level lower than that of the supply voltage VDD by the transistor TR9. Due thereto, the sensing node SO of the page buffer 131A may be precharged to the level of the supply voltage VDD, but the potential level of the sensing node SO may be discharged to a ground level or may be decreased to the same level as the precharge level of the page buffer common node PBUS, depending on the data transmitted from the cache latch component 132A during the data transmission operation.

In contrast, during a data sensing operation of sensing the state of the memory cell coupled to the bit line BL1, the sensing node SO may be maintained at the level of the supply voltage VDD that is the precharged level or may be discharged to a discharge level VSA_CSOC−Vth.

Accordingly, the main latch component 335 may use a relatively low trip voltage during the data transmission operation, and may use a relatively high trip voltage during the data sensing operation, thus improving the accuracy of the data latch operation.

The main latch component 335 according to an embodiment of the present disclosure may include the two or more NMOS transistors N36 and N37 coupled in parallel between the node ND14 and the ground power source VSS, and the two or more NMOS transistors N36 and N37 may be operated depending on the potential of the sensing node SO. Also, the NMOS transistor N38 that is driven in response to the enable signal EN which is activated to a logic high level only during a data transmission operation may be disposed between the NMOS transistor N36 and the ground power source VSS. As a result, in the main latch component 335, the first current path through which current flows into the ground power source VSS through the NMOS transistors N36 and N37 may be formed during a data transmission operation, and thus a first trip voltage having a relatively low potential may be set by relatively strengthening the pull-down current path of the node QM. Also, in the main latch component 335, the second current path through which current flows into the ground power source VSS through the NMOS transistor N37 may be formed during a data sensing operation, and thus a second trip voltage having a relatively high potential may be set by relatively weakening the pull-down current path of the node QM. Therefore, the main latch component 335 may perform a data latch operation using the relatively low first trip voltage during the data transmission operation, and may perform a data latch operation using the relatively high second trip voltage during the data sensing operation.

Figure 11:
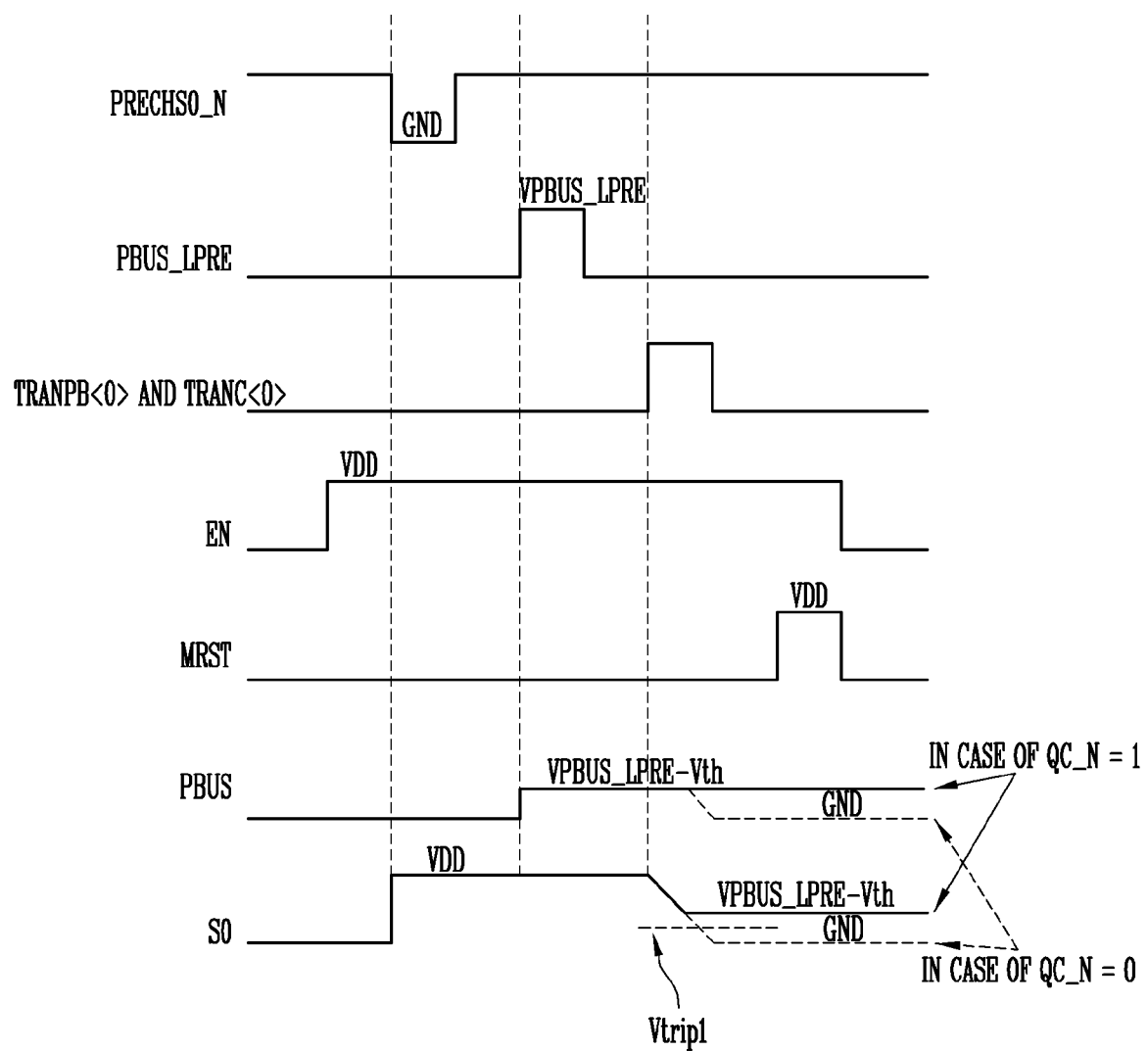
FIG. 11 is a waveform diagram of signals illustrating a data transmission operation between a cache latch component and a page buffer, such as those of FIG. 10.

FIG. 11 is a waveform diagram of signals illustrating a data transmission operation between the cache latch component and the page buffer of FIG. 10.

A data transmission operation between the cache latch component 132A and the page buffer 131A is described below with reference to FIGS. 10 and 11.

During a data transmission operation, the enable signal EN of a logic high level may be applied to the NMOS transistor N38, and thus the NMOS transistor N38 may remain turned on.

The sensing node precharger 333 may apply the supply voltage VDD to the sensing node SO in response to the sensing node precharge signal PRECHSO_N at a logic low level (GND) during a set period of time. Due thereto, the sensing node SO is precharged to the level of the supply voltage VDD. After a set period of time has elapsed, the sensing node precharge signal PRECHSO_N makes a transition to a logic high level VDD, and then the PMOS transistor P23 is turned off.

The transistor TR9 applies the supply voltage VDD to the page buffer common node PBUS in response to the common node precharge signal PBUS_LPRE at a low precharge level VPBUS_LPRE for a set period of time. Accordingly, the page buffer common node PBUS may be precharged to a first level VPBUS_LPRE−Vth. The first level VPBUS_LPRE−Vth is lower than the level VDD to which the sensing node SO is precharged.

The transistor TR11 is turned on in response to a cache latch transmission signal TRANC<0>, and the transistor TR1 is turned on in response to a page buffer transmission signal TRANPB<0>. Due thereto, the page buffer common node PBUS is electrically coupled to the sensing node SO, so that the page buffer common node PBUS is maintained at the first level VPBUS_LPRE−Vth or is discharged to the logic low level GND depending on the data stored in the cache latch component 132A, and the sensing node SO is decreased to the first level VPBUS_LPRE−Vth, which is the precharge level of the page buffer common node PBUS, or is discharged to the logic low level GND. For example, when the node QC_N of the cache latch component 132A is at a logic low level (QC_N=0), the page buffer common node PBUS and the sensing node SO may be discharged to the logic low level GND. When the node QC_N of the cache latch component 132A is at a logic high level (QC_N=1), the potentials of the page buffer common node PBUS and the sensing node SO may be the first level VPBUS_LPRE−Vth.

The NMOS transistor N36 and the NMOS transistor N37 of the main latch component 335 may be turned on or off depending on the potential level of the sensing node SO, and the NMOS transistor N34 may be turned on in response to a reset signal MRST.

When the NMOS transistor N36 and the NMOS transistor N37 are turned on depending on the potential level of the sensing node SO, a first current path including both a current path through which current flows from the node ND14 into the ground power source VSS through the NMOS transistor N36 and the NMOS transistor N38 and a current path through which current flows from the node ND14 into the ground power source VSS through the NMOS transistor N37 may be formed. Due thereto, the first trip voltage Vtrip1 of the main latch component 335 is set to a potential between the logic low level GND and the first level VPBUS_LPRE−Vth, and the main latch component 335 may latch first data (e.g., "0") and second data (e.g., "1") based on the potential levels of the set first trip voltage Vtrip1 and the potential level of the sensing node SO.

Figure 12:
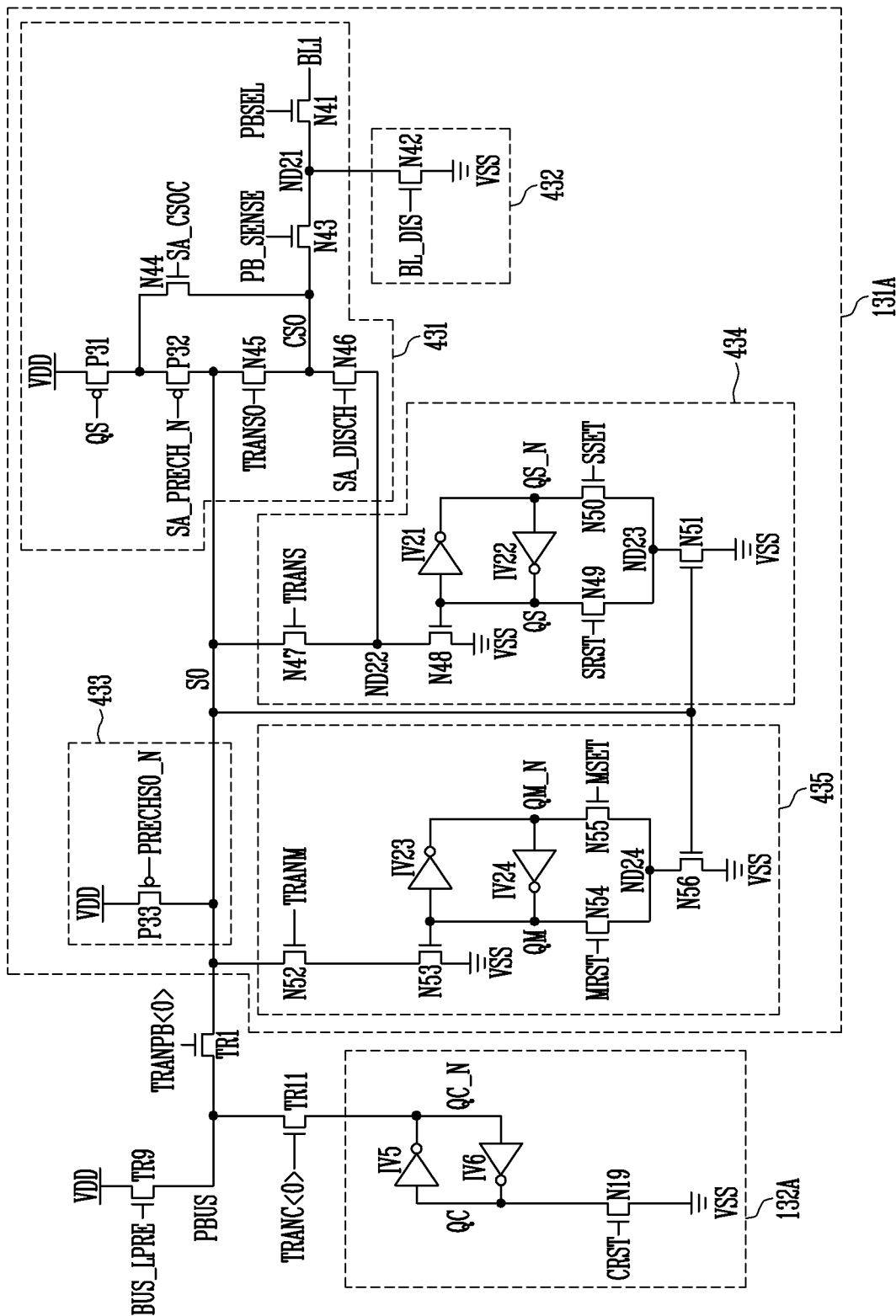
FIG. 12 is a circuit diagram illustrating a page buffer according to an embodiment of the present disclosure.

FIG. 12 is a circuit diagram illustrating a page buffer according to an embodiment of the present disclosure.

Referring to FIG. 12, a page buffer 131A may include a bit line controller 431, a bit line discharger 432, a sensing node precharger 433, a sub-latch component 434, and a main latch component 435.

The bit line controller 431 may control the potential level of a sensing node SO based on the amount of current of a bit line BL1 that changes depending on the program state of a memory cell coupled to the bit line BL1 during a data sensing operation of a read operation or a verify operation.

The bit line controller 431 may include a plurality of NMOS transistors N41 and N43 to N46 and a plurality of PMOS transistors P31 and P32.

The NMOS transistor N41 may be coupled between the bit line BL1 and a node ND21 and may electrically couple the bit line BL1 to the node ND21 in response to a page buffer select signal PBSEL.

The NMOS transistor N43 may be coupled between the node ND21 and a common node CSO and may electrically couple the node ND21 to the common node CSO in response to a page buffer sensing signal PB_SENSE.

The PMOS transistor P31 and the PMOS transistor P32 may be coupled in series between a supply voltage VDD and a sensing node SO, and may be turned on in response to a signal at a node QS of the sub-latch component 434 and a precharge signal SA_PRECH_N, respectively.

The NMOS transistor N44 may be coupled between a node between the PMOS transistor P31 and the PMOS transistor P32 and the common node CSO, and may provide the supply voltage VDD, provided through the PMOS transistor P31, to the common node CSO in response to a control signal SA_CSOC.

The NMOS transistor N45 may be coupled between the sensing node SO and the common node CSO and may electrically couple the sensing node SO to the common node CSO in response to a transmission signal TRANSO.

The NMOS transistor N46 may be coupled between the common node CSO and a node ND22 of the sub-latch component 434 and may electrically couple the common node CSO to the node ND22 in response to a discharge signal SA_DISCH.

The operation of the bit line controller 431 during a data sensing operation is described below.

The PMOS transistor P31 and the PMOS transistor P32 may precharge the sensing node SO to the level of the supply voltage VDD in response to both the node QS of the sub-latch component 434 and the precharge signal SA_PRECH_N being at a logic low level. The NMOS transistor N45 may be turned on in response to the transmission signal TRANSO at a logic high level, and the common node CSO may be precharged to a level 'VDD−Vth'.

Thereafter, during an interval from when the precharge signal SA_PRECH_N makes a transition to a logic high level to when the transmission signal TRANSO makes a transition to a logic low level, an evaluation operation may be performed. The PMOS transistor P32 may be turned off in response to the precharge signal SA_PRECH_N which has made a transition to a logic high level, thus interrupting the supply voltage VDD applied to the sensing node SO. The potential levels of the sensing node SO and the common node CSO may change depending on the program state of the memory cell coupled to the bit line BL1. For example, when the memory cell is in a program state in which the threshold voltage of the memory cell is higher than a read voltage or a verify voltage applied to the word line of the memory cell during a read or verify operation, current does not flow through the bit line BL1. Accordingly, the potentials of the common node CSO and the sensing node SO may be maintained at the precharge level. In contrast, when the memory cell is in an erased state in which the threshold voltage of the memory cell is lower than the read voltage or the verify voltage applied to the word line of the memory cell during the read or verify operation, current flows through the bit line BL1. Accordingly, the potentials of the common node CSO and the sensing node SO may be decreased to the discharge level VSA_CSOC−Vth from the precharged level.

The bit line discharger 432 may be coupled to the node ND21 of the bit line controller 431 to discharge the potential level of the bit line BL1.

The bit line discharger 432 may include an NMOS transistor N42 coupled between the node ND21 and a ground power source VSS, and the NMOS transistor N42 may apply the ground power VSS to the node ND21 in response to a bit line discharge signal BL_DIS.

The sensing node precharger 433 may be coupled between the sensing node SO and the supply voltage VDD to precharge the sensing node SO to the level of the supply voltage VDD.

The sensing node precharger 433 may include a PMOS transistor P33, and the PMOS transistor P33 may apply the supply voltage VDD to the sensing node SO in response to a sensing node precharge signal PRECHSO_N.

The sub-latch component 434 may include a plurality of NMOS transistors N47 to N51 and inverters IV21 and IV22.

The inverters IV21 and IV22 may be coupled in parallel in opposite directions between the node QS and a node QS_N, thus forming a latch.

The NMOS transistor N47 and the NMOS transistor N48 may be coupled in series between the sensing node SO and the ground power source VSS, wherein the NMOS transistor N47 is turned on in response to the transmission signal TRANS and the NMOS transistor N48 is turned on or off depending on the potential level of the node QS.

The NMOS transistor N49 may be coupled between the node QS and the node ND23 and may then electrically couple the node QS to the node ND23 in response to a reset signal SRST. The NMOS transistor N50 may be coupled between the node QS_N and the node ND23 and may then electrically couple the node QS_N to the node ND23 in response to a set signal SSET. The NMOS transistor N51 may be coupled between the node ND23 and the ground power source VSS, and may be turned on depending on the potential of the sensing node SO to electrically couple the node ND23 to the ground power source VSS. For example, when the reset signal SRST of a logic high level is applied to the NMOS transistor N49 in the state in which the sensing node SO is precharged to a high level, the node QS and the node QS_N may be initialized to a logic low level and a logic high level, respectively. Further, when the set signal SSET of a logic high level is applied to the NMOS transistor N50 in the state in which the sensing node SO is precharged to a logic high level, the node QS and the node QS_N may be set to a logic high level and a logic low level, respectively. During a data sensing operation, the node QS may be set to a logic low level.

The main latch component 435 may include a plurality of NMOS transistors N52 to N56 and inverters IV23 and IV24.

The inverters IV23 and IV24 may be coupled in parallel in opposite directions between a node QM and a node QM_N, thus forming a latch. In the inverter IV24 which controls the potential of the node QM by inverting the potential level of the node QM_N, a pull-up current path may be blocked during a data transmission operation. Due thereto, during the data transmission operation, the pull-up current path of the node QM may be weakened, and thus a first trip voltage of the main latch component 435 may be relatively decreased. Also, in the inverter IV24, a pull-up current path may be normally operated during a data sensing operation, and may be strengthened compared to that during the data transmission operation, and thus the second trip voltage of the main latch component 435 may be relatively high.

The inverter IV24 is described in detail with reference to FIG. 13.

The NMOS transistor N52 and the NMOS transistor N53 may be coupled in series between the sensing node SO and the ground power source VSS, wherein the NMOS transistor N52 is turned on in response to a transmission signal TRANM and the NMOS transistor N53 is turned on or off depending on the potential level of the node QM.

The NMOS transistor N54 may be coupled between the node QM and the node ND24 and may then electrically couple the node QM to the node ND24 in response to a reset signal MRST. The NMOS transistor N55 may be coupled between the node QM_N and the node ND24 and may then electrically couple the node QM_N to the node ND24 in response to a set signal MSET.

The NMOS transistor N56 may be coupled between the node ND24 and the ground power source VSS, and may be turned on or off depending on the potential of the sensing node SO. The main latch component 435 may set the potential of the node QM so that the potential of the QM is of a logic high level during an initialization operation for the data transmission operation and the data sensing operation. For example, when the set signal MSET of a logic high level is applied to the NMOS transistor N55 in the state in which the sensing node SO is precharged to a logic high level, the node QM and the node QM_N may be set to a logic high level and a logic low level, respectively.

Since the structure of the catch latch component 132A is identical to that of the cache latch component described with reference to FIG. 7, detailed description thereof is omitted here.

During a data transmission operation of transmitting the data stored in the cache latch component 132A to the main latch component 435 of the page buffer 131A, a page buffer common node PBUS may be precharged to a level lower than that of the supply voltage VDD by the transistor TR9. Due thereto, the sensing node SO of the page buffer 131A may be precharged to the level of the supply voltage VDD, but the potential level of the sensing node SO may be discharged to a ground level or may be decreased to the same level as the precharge level of the page buffer common node PBUS, depending on the data transmitted from the cache latch component 132A during the data transmission operation.

In contrast, during a data sensing operation of sensing the state of the memory cell coupled to the bit line BL1, the sensing node SO may be maintained at the level of the supply voltage VDD that is the precharged level or may be discharged to a discharge level VSA_CSOC−Vth.

Accordingly, the main latch component 435 may use a relatively low trip voltage during the data transmission operation, and may use a relatively high trip voltage during the data sensing operation, thus improving the accuracy of the data latch operation.

Figure 13:
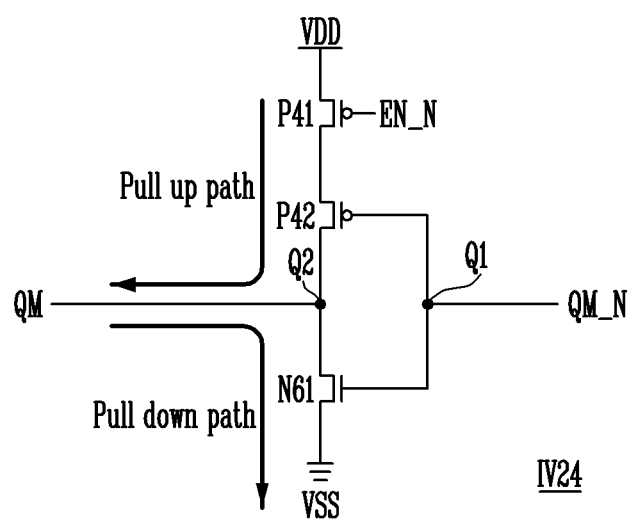
FIG. 13 is a circuit diagram illustrating an inverter IV24 of a main latch component, such as that of FIG. 12.

FIG. 13 is a circuit diagram illustrating the inverter IV24 of the main latch component of FIG. 12.

Referring to FIG. 13, the inverter IV24 may include PMOS transistors P41 and P42 and an NMOS transistor N61 which are coupled in series between the supply voltage VDD and the ground power source VSS.

The PMOS transistors P41 and P42 are coupled in series between the supply voltage VDD and an output node Q2 coupled to the node QM. The PMOS transistor P41 is turned on or off in response to an inverted enable signal EN_N, thus providing or interrupting the supply voltage VDD to the PMOS transistor P42. The inverted enable signal EN_N of a logic high level may be applied during a data transmission operation, and the inverted enable signal EN_N of a logic low level may be applied when the data transmission operation is not being performed, for example, when a data sensing operation is performed. A gate of the PMOS transistor P42 is coupled to an input node Q1 coupled to a node QM_N, and is turned on or off based on the potential level of the node QM_N. The NMOS transistor N61 is coupled between the output node Q2 and the ground power source VSS, with a gate of the NMOS transistor N61 coupled to the node QM_N, and is then turned on or off based on the potential level of the node QM_N.

When the data transmission operation is not performed, for example, when another operation such as the data sensing operation is performed, the inverted enable signal EN_N of a logic low level is applied, and then the PMOS transistor P41 is turned on. When the potential level of the input node Q1 is applied as a logic high level, the NMOS transistor N61 is turned on to form a pull-down current path through which current flows from the output node Q2 into the ground power source VSS, and the PMOS transistor P42 is turned off to prevent a pull-up current path from being formed. Accordingly, the output node Q2 is of a logic low level. In contrast, when the potential level of the input node Q1 is applied as a logic low level, the NMOS transistor N61 is turned off to prevent a pull-down current path from being formed, and the PMOS transistor P42 is turned on to form a pull-up current path. Accordingly, the output node Q2 is of a logic high level. That is, when the data transmission operation is not performed, for example, when the data sensing operation is performed, a pull-up current path or a pull-down current path may be formed based on the potential of the input node Q1.

During the data transmission operation, the inverted enable signal EN_N of a logic high level may be applied, and then the PMOS transistor P41 may be turned off. Accordingly, a pull-up current path is not formed regardless of the potential level of the input node Q1. That is, during the data transmission operation, a pull-up current path is not formed regardless of the potential of the input node Q1.

In an embodiment of the present disclosure, a first trip voltage having a relatively low potential may be set by blocking the pull-up current path of the inverter IV24 which controls the potential level of the node QM of the main latch component 435 during the data transmission operation. That is, the first trip voltage having a relatively low potential may be set by weakening the pull-up current path of the node QM during the data transmission operation. Also, when the data transmission operation is not performed, for example, when another operation such as the data sensing operation is performed, the inverter IV24 may form a pull-up current path and a pull-down current path based on the potential of the node QM_N, thus setting a second trip voltage having a relatively high potential. Therefore, the main latch component 335 may perform a data latch operation using the relatively low first trip voltage during the data transmission operation, and may perform a data latch operation using the relatively high second trip voltage during the data sensing operation.

Figure 14:
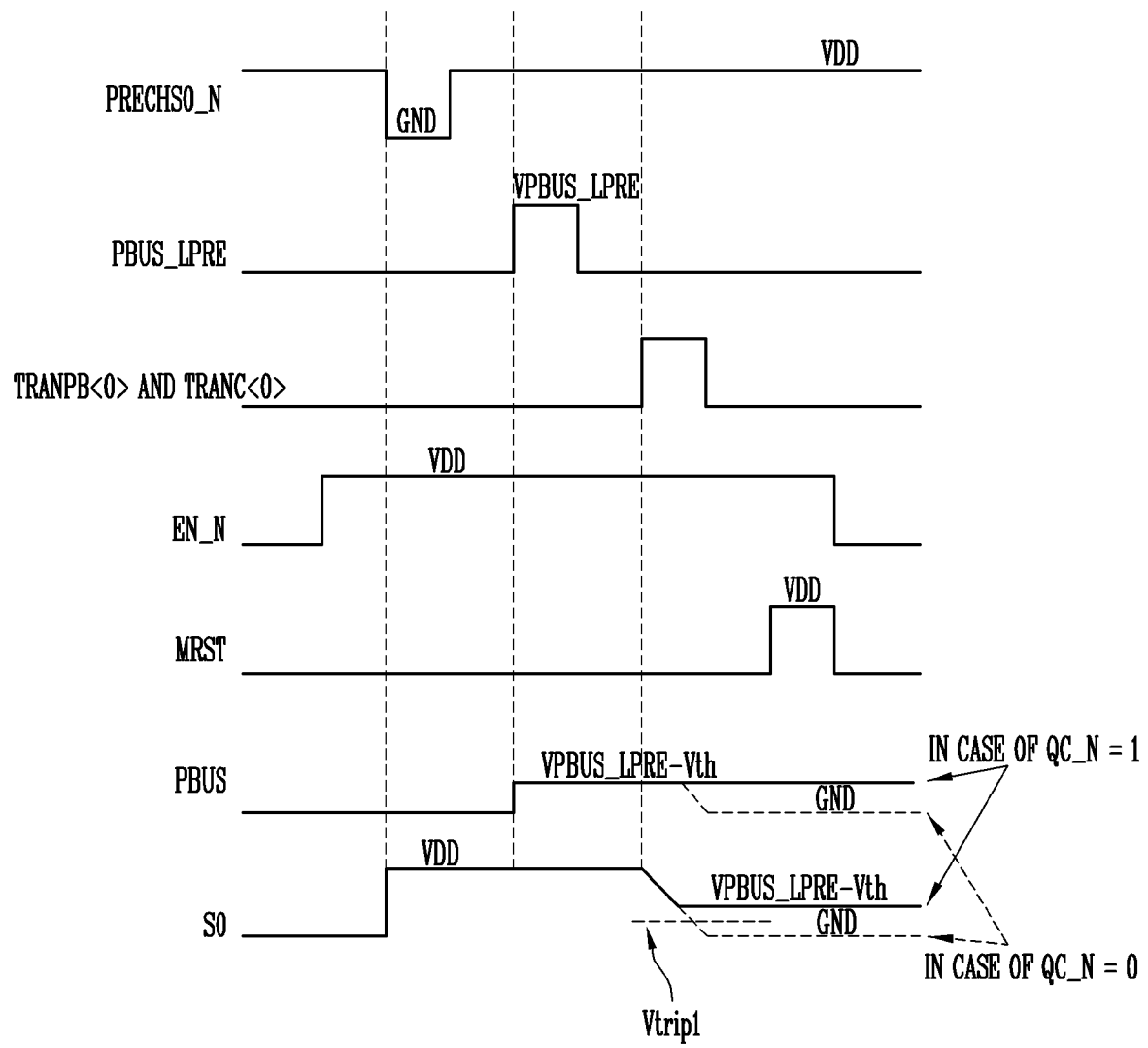
FIG. 14 is a waveform diagram of signals illustrating a data transmission operation between a cache latch component and a page buffer, such as those of FIG. 12.

FIG. 14 is a waveform diagram of signals illustrating a data transmission operation between the cache latch component and the page buffer of FIG. 12.

The data transmission operation between the cache latch component 132A and the page buffer 131A is described below with reference to FIGS. 12 to 14.

During the data transmission operation, an inverted enable signal EN_N of a logic high level may be applied, and thus a pull-up current path through which current is applied to the node QM of the main latch component 435 is interrupted.

The sensing node precharger 433 may apply the supply voltage VDD to the sensing node SO in response to the sensing node precharge signal PRECHSO_N of a logic low level (GND) during a set period of time. Due thereto, the sensing node SO is precharged to the level of the supply voltage VDD. After a set period of time has elapsed, the sensing node precharge signal PRECHSO_N makes a transition to a logic high level VDD, and then the PMOS transistor P33 is turned off.

The transistor TR9 applies the supply voltage VDD to the page buffer common node PBUS in response to the common node precharge signal PBUS_LPRE of a low precharge level VPBUS_LPRE for a set period of time. Accordingly, the page buffer common node PBUS may be precharged to a first level VPBUS_LPRE–Vth. The first level VPBUS_LPRE–Vth is lower than the level VDD to which the sensing node SO is precharged.

The transistor TR11 is turned on in response to a cache latch transmission signal TRANC<0>, and the transistor TR1 is turned on in response to a page buffer transmission signal TRANPB<0>. Due thereto, the page buffer common node PBUS is electrically coupled to the sensing node SO, so that the page buffer common node PBUS is maintained at the first level VPBUS_LPRE–Vth or is discharged to the logic low level GND depending on the data stored in the cache latch component 132A, and the sensing node SO is decreased to the first level VPBUS_LPRE–Vth, which is the precharge level of the page buffer common node PBUS, or is discharged to the logic low level GND. For example, when the node QC_N of the cache latch component 132A is at a logic low level (QC_N=0), the page buffer common node PBUS and the sensing node SO may be discharged to the logic low level GND. When the node QC_N of the cache latch component 132A is at a logic high level (QC_N=1), the potentials of the page buffer common node PBUS and the sensing node SO may be the first level VPBUS_LPRE–Vth.

The NMOS transistor N56 of the main latch component 435 may be turned on or off depending on the potential level of the sensing node SO, and the NMOS transistor N54 may be turned on in response to the reset signal MRST.

When the NMOS transistor N56 is turned on depending on the potential level of the sensing node SO, a current path through which current flows from the node ND24 into the ground power source VSS through the NMOS transistor N56 is formed. In the state in which the pull-up current path of the inverter IV24 is blocked, a current path through which current flows from the node ND24 into the ground power source VSS through the NMOS transistor N56 is formed. Accordingly, the first trip voltage Vtrip1 of the main latch component 435 is set to a potential between the logic low level GND and the first level VPBUS_LPRE–Vth. The main latch component 435 may latch first data (e.g., "0") and second data (e.g., "1") based on the set first trip voltage Vtrip1 and the potential level of the sensing node SO.

Figure 15:
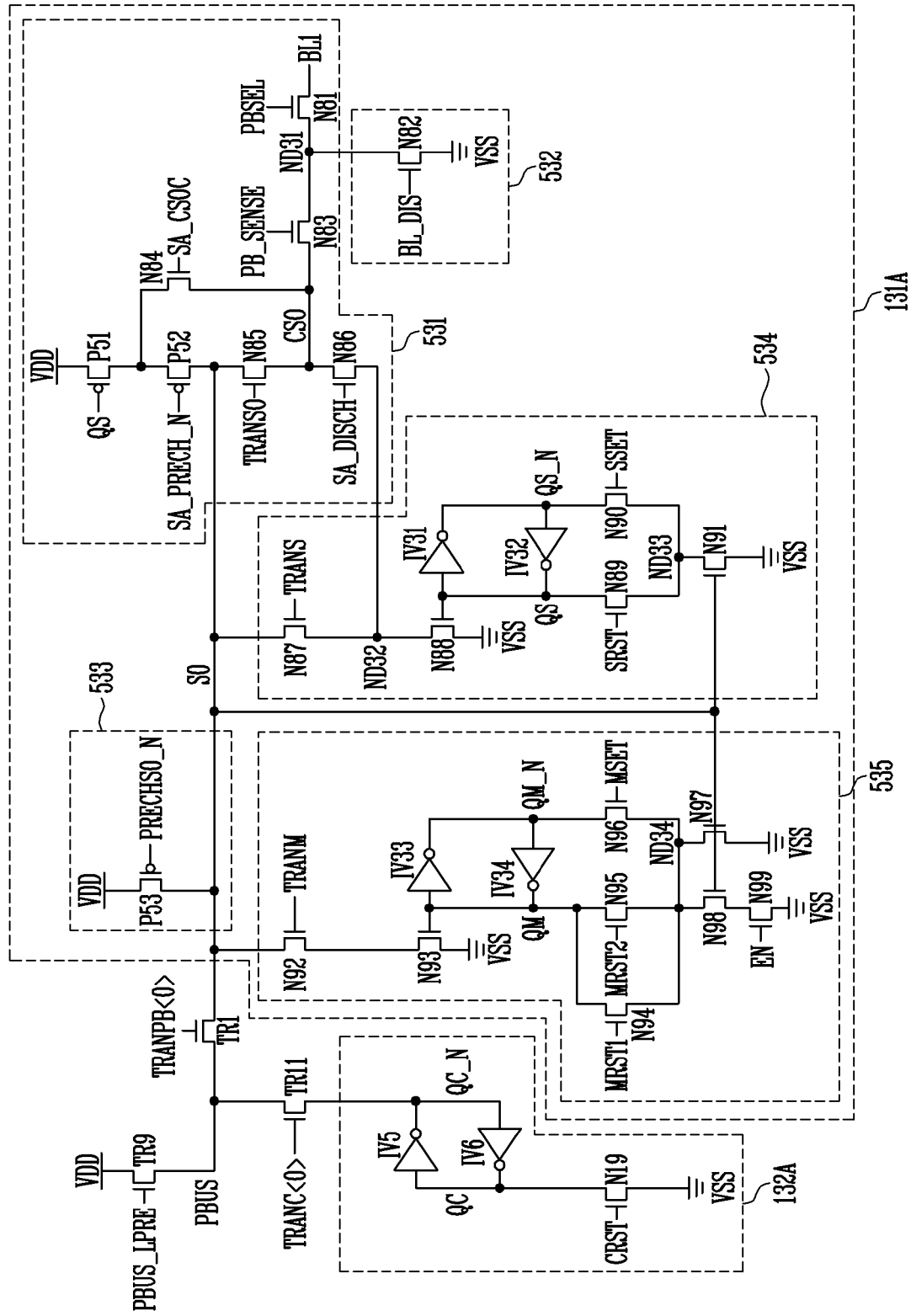
FIG. 15 is a circuit diagram illustrating a page buffer according to an embodiment of the present disclosure.

FIG. 15 is a circuit diagram illustrating a page buffer according to an embodiment of the present disclosure.

Referring to FIG. 15, a page buffer 131A may include a bit line controller 531, a bit line discharger 532, a sensing node precharger 533, a sub-latch component 534, and a main latch component 535.

The bit line controller 531 may control the potential level of a sensing node SO based on the amount of current of a bit line BL1 that changes depending on the program state of a memory cell coupled to the bit line BL1 during a data sensing operation of a read operation or a verify operation.

The bit line controller 531 may include a plurality of NMOS transistors N81 and N83 to N86 and a plurality of PMOS transistors P51 and P52.

The NMOS transistor N81 may be coupled between the bit line BL1 and a node ND31 and may electrically couple the bit line BL1 to the node ND31 in response to a page buffer select signal PBSEL.

The NMOS transistor N83 may be coupled between the node ND31 and a common node CSO and may electrically couple the node ND31 to the common node CSO in response to a page buffer sensing signal PB_SENSE.

The PMOS transistor P51 and the PMOS transistor P52 may be coupled in series between a supply voltage VDD and a sensing node SO, and may be turned on in response to a signal at a node QS of the sub-latch component 534 and a precharge signal SA_PRECH_N, respectively.

The NMOS transistor N84 may be coupled between a node between the PMOS transistor P51 and the PMOS transistor P52 and the common node CSO, and may provide the supply voltage VDD, provided through the PMOS transistor P51, to the common node CSO in response to a control signal SA_CSOC.

The NMOS transistor N85 may be coupled between the sensing node SO and the common node CSO and may electrically couple the sensing node SO to the common node CSO in response to a transmission signal TRANSO.

The NMOS transistor N86 may be coupled between the common node CSO and a node ND32 of the sub-latch component 534 and may electrically couple the common node CSO to the node ND32 in response to a discharge signal SA_DISCH.

The operation of the bit line controller 531 during a data sensing operation is described below.

The PMOS transistor P51 and the PMOS transistor P52 may precharge the sensing node SO to the level of the supply voltage VDD in response to both the node QS of the sub-latch component 534 and the precharge signal SA_PRECH_N being at a logic low level. The NMOS transistor N85 may be turned on in response to the transmission signal TRANSO at a logic high level, and the common node CSO may be precharged to a level 'VDD-Vth'.

Thereafter, during an interval from when the precharge signal SA_PRECH_N makes a transition to a logic high level to when the transmission signal TRANSO makes a transition to a logic low level, an evaluation operation may be performed. The PMOS transistor P52 may be turned off in response to the precharge signal SA_PRECH_N which has made a transition to a logic high level, thus interrupting the supply voltage VDD applied to the sensing node SO. The potential levels of the sensing node SO and the common node CSO may change depending on the program state of the memory cell coupled to the bit line BL1. For example, when the memory cell is in a program state in which the threshold voltage of the memory cell is higher than a read voltage or a verify voltage applied to the word line of the memory cell during a read or verify operation, current does not flow through the bit line BL1. Accordingly, the potentials of the common node CSO and the sensing node SO may be maintained at the precharge level. In contrast, when the memory cell is in an erased state in which the threshold voltage of the memory cell is lower than the read voltage or the verify voltage applied to the word line of the memory cell during the read or verify operation, current flows through the bit line BL1. Accordingly, the potentials of the common node CSO and the sensing node SO may be decreased to the discharge level VSA_CSOC-Vth from the precharged level.

The bit line discharger 532 may be coupled to the node ND31 of the bit line controller 531 to discharge the potential level of the bit line BL1.

The bit line discharger 532 may include an NMOS transistor N82 coupled between the node ND31 and a ground power source VSS, and the NMOS transistor N82 may apply the ground power VSS to the node ND31 in response to a bit line discharge signal BL_DIS.

The sensing node precharger 533 may be coupled between the sensing node SO and the supply voltage VDD to precharge the sensing node SO to the level of the supply voltage VDD.

The sensing node precharger 533 may include a PMOS transistor P53, and the PMOS transistor P53 may apply the supply voltage VDD to the sensing node SO in response to a sensing node precharge signal PRECHSO_N.

The sub-latch component 534 may include a plurality of NMOS transistors N87 to N91 and inverters IV31 and IV32.

The inverters IV31 and IV32 may be coupled in parallel in opposite directions between the node QS and a node QS_N, thus forming a latch.

The NMOS transistor N87 and the NMOS transistor N88 may be coupled in series between the sensing node SO and the ground power source VSS, wherein the NMOS transistor N87 is turned on in response to the transmission signal TRANS and the NMOS transistor N88 is turned on or off depending on the potential level of the node QS.

The NMOS transistor N89 may be coupled between the node QS and the node ND33 and may then electrically couple the node QS to the node ND33 in response to a reset signal SRST. The NMOS transistor N90 may be coupled between the node QS_N and the node ND33 and may then electrically couple the node QS_N to the node ND33 in response to a set signal SSET. The NMOS transistor N91 may be coupled between the node ND33 and the ground power source VSS, and may be turned on depending on the potential of the sensing node SO to electrically couple the node ND33 to the ground power source VSS. For example, when the reset signal SRST of a logic high level is applied to the NMOS transistor N89 in the state in which the sensing node SO is precharged to a high level, the node QS and the node QS_N may be initialized to a logic low level and a logic high level, respectively. Further, when the set signal SSET of a logic high level is applied to the NMOS transistor N90 in the state in which the sensing node SO is precharged to a logic high level, the node QS and the node QS_N may be set to a logic high level and a logic low level, respectively. During a data sensing operation, the node QS may be set to a logic low level.

The main latch component 535 may include a plurality of NMOS transistors N92 to N99 and inverters IV33 and IV34.

The inverters IV33 and IV34 may be coupled in parallel in opposite directions between a node QM and a node QM_N, thus forming a latch. The inverter IV34 may be configured in the same manner as the inverter IV24 illustrated in FIG. 13. In the inverter IV34 which controls the potential of the node QM by inverting the potential level of the node QM_N, a pull-up current path may be blocked during a data transmission operation. Due thereto, during the data transmission operation, the pull-up current path of the node QM may be weakened, and thus a first trip voltage of the main latch component 535 may be relatively decreased. Also, in the inverter IV34, a pull-up current path may be normally operated during a data sensing operation, and may be strengthened compared to that during the data transmission operation, and thus the second trip voltage of the main latch component 535 may be relatively high.

The NMOS transistor N92 and the NMOS transistor N93 may be coupled in series between the sensing node SO and the ground power source VSS, wherein the NMOS transistor N92 is turned on in response to a transmission signal TRANM and the NMOS transistor N93 is turned on or off depending on the potential level of the node QM.

The NMOS transistor N94 and the NMOS transistor N95 may be coupled in parallel between the node QM and an ND34, wherein the NMOS transistor N94 is turned on or off in response to a first reset signal MRST1 and the NMOS transistor N95 is turned on or off in response to a second reset signal MRST2. The NMOS transistor N96 may be coupled between the node QM_N and the node ND34 and may then electrically couple the node QM_N to the node ND34 in response to a set signal MSET. The NMOS transistor N94 may be designed to have a size greater than that of the NMOS transistor N96. That is, the NMOS transistor N94 may be designed to have turn-on resistance less than that of the NMOS transistor N96.

The NMOS transistor N98 and the NMOS transistor N99 may be coupled in series between the node ND34 and the ground power source VSS. The NMOS transistor N98 may be turned on or off depending on the potential of the sensing node SO, and the NMOS transistor N99 may be turned on or off in response to an enable signal EN. The enable signal EN of a logic high level may be applied during a data transmission operation. The NMOS transistor N97 may be coupled between the node ND34 and the ground power source VSS, and may be turned on or off depending on the potential of the sensing node SO. That is, the NMOS transistor N98 and the NMOS transistor N99 which are coupled in series may have a structure of being coupled in parallel to the NMOS transistor N97.

In the above-described main latch component 535, a pull-down current path of the node QM may be strengthened by the NMOS transistors N94, N95, N97, N98, and N99 during a data transmission operation, and thus the first trip voltage of the main latch component 535 may be set to a voltage lower than the second trip voltage during the data sensing operation.

Since the structure of the catch latch component 132A is identical to that of the cache latch component described with reference to FIG. 7, detailed description thereof is omitted here.

The main latch component 535 in an embodiment of the present disclosure may include two or more NMOS transistors N94 and N95 coupled in parallel between the node QM and the node ND34, and may include two or more NMOS transistors N97 and N98 coupled in parallel between the node ND34 and the ground power source VSS. During the data transmission operation, the NMOS transistors N94 and N95 may be turned on, and thus the pull-down current path of the node QM may be relatively strengthened. Also, the two or more NMOS transistors N97 and N98 may be operated depending on the potential of the sensing node SO, and the pull-down current path of the node QM and the node ND34 may be relatively strengthened. Due thereto, the main latch component 535 may set a first trip voltage having a relatively low potential during the data transmission operation. Furthermore, the inverter IV34 of the main latch component 535 may block the pull-up current path of the node QM and may then set a trip voltage having a relatively low potential during the data transmission operation. That is, the main latch component 535 may set the first trip voltage during the data transmission operation and set the second trip voltage during the data sensing operation, wherein the first trip voltage may be lower than the second trip voltage. Therefore, the main latch component 535 may perform a data latch operation using the relatively low first trip voltage during the data transmission operation, and may perform a data latch operation using the relatively high second trip voltage during the data sensing operation.

Figure 16:
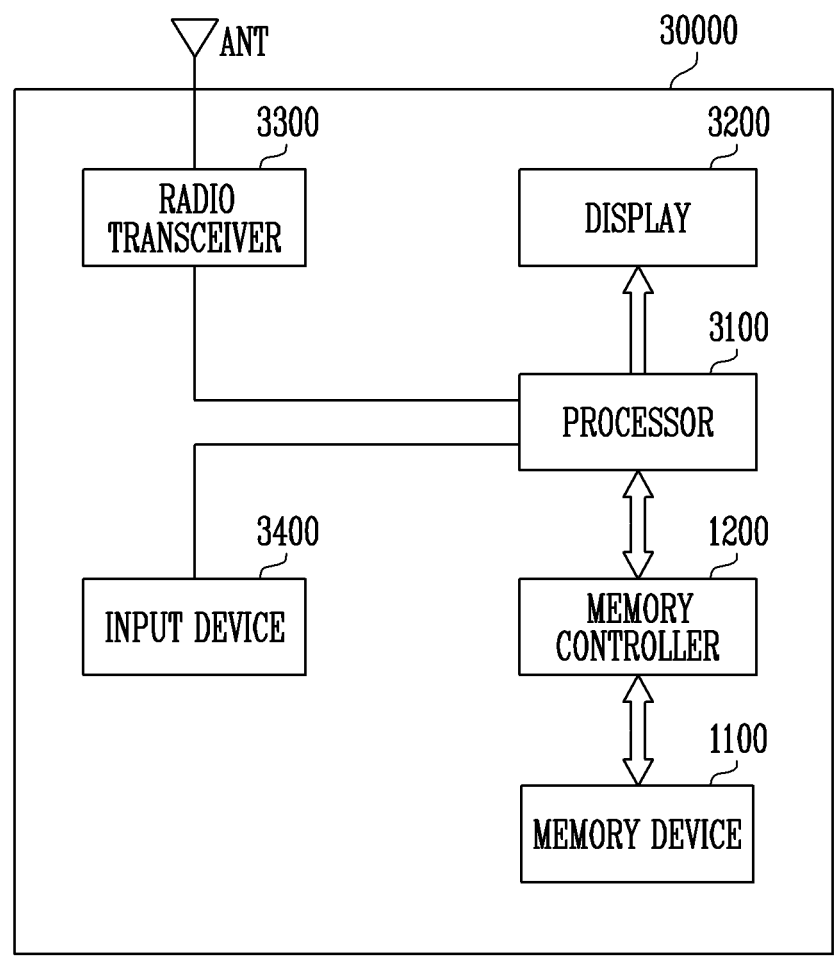
FIG. 16 is a diagram illustrating an embodiment of a memory system.

FIG. 16 is a diagram illustrating an embodiment of a memory system.

Referring to FIG. 16, a memory system 30000 may be implemented as a cellular phone, a smartphone, a tablet PC, a personal digital assistant (PDA) or a wireless communication device. The memory system 30000 may include a memory device 1100 and a memory controller 1200 that is capable of controlling the operation of the memory device 1100. The memory controller 1200 may control a data access operation of the memory device 1100, for example, a program operation, an erase operation or a read operation, under the control of a processor 3100.

Data programmed to the memory device 1100 may be output via a display 3200 under the control of the memory controller 1200.

A radio transceiver 3300 may exchange radio signals through an antenna ANT. For example, the radio transceiver 3300 may convert radio signals received through the antenna ANT into signals that may be processed by the processor 3100. Therefore, the processor 3100 may process the signals output from the radio transceiver 3300 and may transmit the processed signals to the memory controller 1200 or the display 3200. The memory controller 1200 may program the signals processed by the processor 3100 to the memory device 1100. Further, the radio transceiver 3300 may convert signals output from the processor 3100 into radio signals, and output the radio signals to an external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 so that data output from the memory controller 1200, data output from the radio transceiver 3300, or data output from the input device 3400 is output via the display 3200.

In an embodiment, the memory controller 1200 capable of controlling the operation of the memory device 1100 may be implemented as a part of the processor 3100 or as a chip provided separately from the processor 3100. Further, the memory controller 1200 may be implemented, for example, by the controller 1200 illustrated in FIG. 1.

Figure 17:
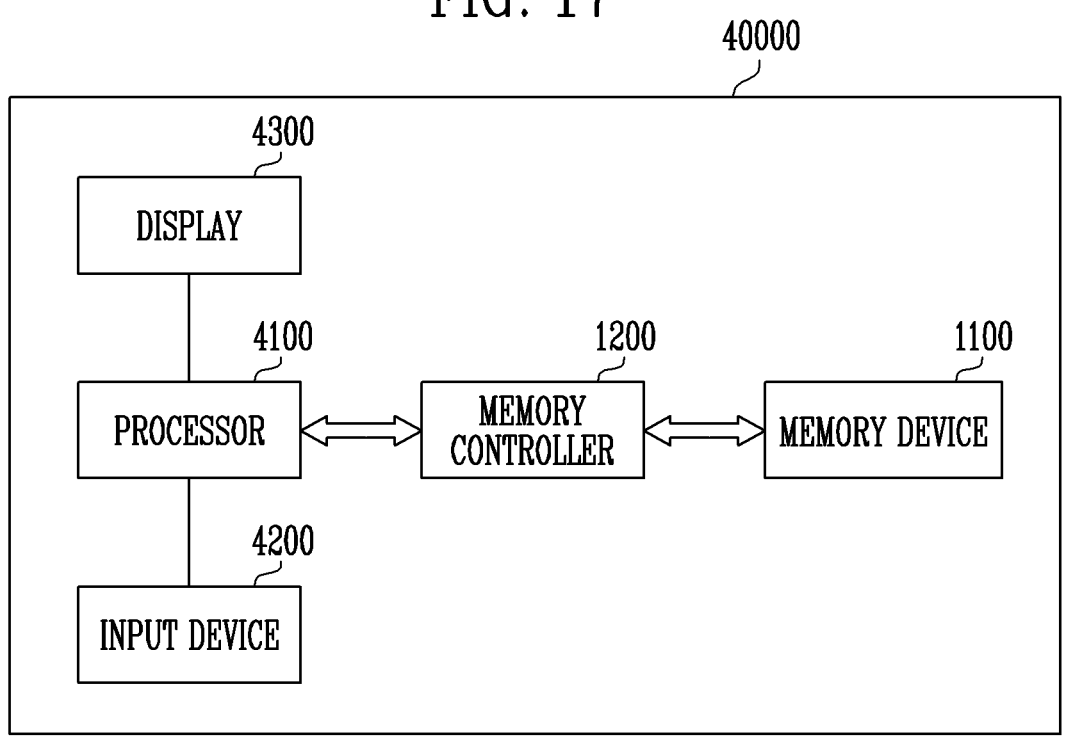
FIG. 17 is a diagram illustrating an embodiment of a memory system.

FIG. 17 is a diagram illustrating an embodiment of a memory system.

Referring to FIG. 17, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include a memory device 1100 and a memory controller 1200 that is capable of controlling a data processing operation of the memory device 1100.

A processor 4100 may output data, stored in the memory device 1100, via a display 4300 according to data input through an input device 4200. For example, the input device 4200 may be implemented as a pointing device such as a touch pad or a computer mouse, a keypad or a keyboard.

The processor 4100 may control overall operation of the memory system 40000 and may control the operation of the memory controller 1200. In an embodiment, the memory controller 1200 capable of controlling the operation of the memory device 1100 may be implemented as a part of the processor 4100 or as a chip provided separately from the processor 4100. Further, the memory controller 1200 may be implemented, for example, by the controller 1200 illustrated in FIG. 1.

Figure 18:
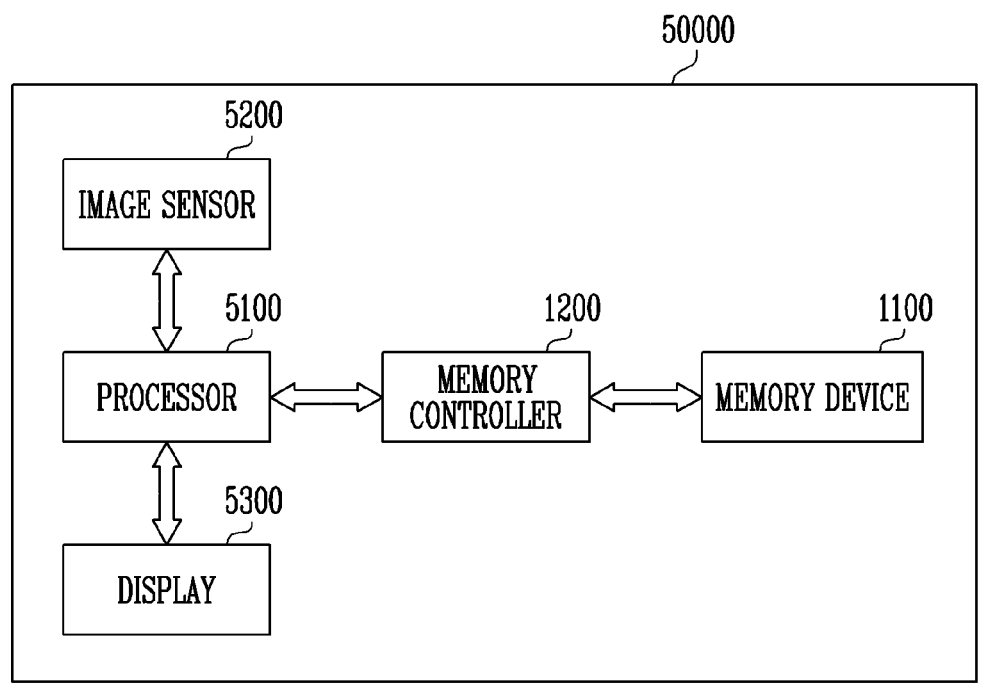
FIG. 18 is a diagram illustrating an embodiment of a memory system.

FIG. 18 is a diagram illustrating an embodiment of a memory system.

Referring to FIG. 18, a memory system 50000 may be implemented as an image processing device, e.g., a digital camera, a mobile phone provided with a digital camera, a smartphone provided with a digital camera, or a tablet PC provided with a digital camera.

The memory system 50000 may include a memory device 1100 and a memory controller 1200 that is capable of controlling a data processing operation for the memory device 1100, for example, a program operation, an erase operation or a read operation.

An image sensor 5200 of the memory system 50000 may convert an optical image into digital signals, and the digital signals may be transmitted to a processor 5100 or the memory controller 1200. Under the control of the processor 5100, the digital signals may be output via a display 5300 or may be stored in the memory device 1100 through the memory controller 1200. Further, data stored in the memory device 1100 may be output via the display 5300 under the control of the processor 5100 or the memory controller 1200.

In an embodiment, the memory controller 1200 capable of controlling the operation of the memory device 1100 may be implemented as a part of the processor 5100 or as a chip provided separately from the processor 5100. Further, the memory controller 1200 may be implemented, for example, by the controller 1200 illustrated in FIG. 1.

Figure 19:
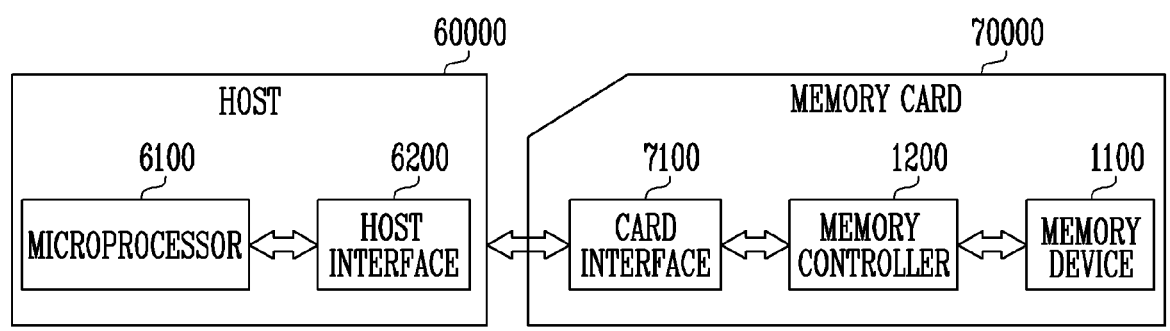
FIG. 19 is a diagram illustrating an embodiment of a memory system.

FIG. 19 is a diagram illustrating an embodiment of a memory system.

Referring to FIG. 19, a memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In an embodiment, the card interface 7100 may be, but is not limited to, a secure digital (SD) card interface or a multi-media card (MMC) interface. Further, the memory controller 1200 may be implemented, for example, by the controller 1200 illustrated in FIG. 1.

Further, the card interface 7100 may interface data exchange between a host 60000 and the memory controller 1200 according to a protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method performed by the hardware.

When the memory system 70000 is coupled to a host interface 6200 of the host 60000 such as a PC, a tablet PC, a digital camera, a digital audio player, a mobile phone, console video game hardware, or a digital set-top box, the host interface 6200 may perform data communication with the memory device 1100 through the card interface 7100 and the memory controller 1200 under the control of a microprocessor 6100.

In accordance with the present disclosure, the trip voltage of a latch component in a data transmission operation and the trip voltage of the latch component in a data sensing operation may be optimized and set, and thus the performance of the data transmission operation and the data sensing operation of a page buffer may be improved.

Although various embodiments of the present disclosure have been disclosed, those skilled in the art will appreciate that various modifications, additions and substitutions are possible, without departing from the scope and spirit of the present invention. The present invention encompasses all such variations that fall within the scope of the claims.

What is claimed is:

1. A page buffer, comprising:
a sensing node, of which a potential is controlled based on an amount of current flowing through a bit line during a data sensing operation and based on a potential of a page buffer common node during a data transmission operation; and
a main latch component configured to latch data based on the potential of the sensing node,
wherein the main latch component latches the data depending on a first trip voltage and the potential of the sensing node during the data transmission operation, and latches the data depending on a second trip voltage and the potential of the sensing node during the data sensing operation, the first trip voltage and the second trip voltage being different.

2. The page buffer according to claim 1, wherein the first trip voltage is lower than the second trip voltage.

3. The page buffer according to claim 1, wherein:
the main latch component comprises a latch including a first node and a second node, and
the first node is configured such that resistance of a first pull-down current path during the data transmission operation is less than resistance of a second pull-down current path during the data sensing operation.

4. The page buffer according to claim 3, wherein the main latch component further comprises:
first and second inverters coupled in parallel in opposite directions between the first node and the second node;
two or more first transistors coupled in parallel between the first node and a third node; and
a second transistor coupled between the third node and a ground power source and configured to be operated depending on the potential of the sensing node.

5. The page buffer according to claim 4, wherein the two or more first transistors are turned on together in response to a control signal during the data transmission operation to form the first pull-down current path between the first node and the third node.

6. The page buffer according to claim 4, wherein one of the two or more first transistors is turned on in response to a control signal during the data sensing operation to form the second pull-down current path between the first node and the third node.

7. The page buffer according to claim 4, wherein:
the main latch component further comprises a third transistor coupled between the second node and the third node, and
at least one of the first transistors has turn-on resistance less than turn-on resistance of the third transistor.

8. The page buffer according to claim 3, wherein the main latch component further comprises:
first and second inverters coupled in parallel in opposite directions between the first node and the second node;
a first transistor coupled between the first node and a third node and configured to be turned on during the data transmission operation and the data sensing operation;
second and third transistors coupled in series between the third node and a ground power source; and
a fourth transistor coupled between the third node and the ground power source.

9. The page buffer according to claim 8, wherein the second transistor and the fourth transistor are operated depending on the potential of the sensing node.

10. The page buffer according to claim 8, wherein:
the third transistor is operated in response to an enable signal, and
the enable signal is activated during the data transmission operation and is deactivated during the data sensing operation.

11. The page buffer according to claim 8, wherein the main latch component is configured such that:
during the data transmission operation, the first pull-down current path is formed through the second transistor, the third transistor, and the fourth transistor, and
during the data sensing operation, the second pull-down current path is formed through the fourth transistor.

12. The page buffer according to claim 3, wherein:
the latch includes first and second inverters coupled in parallel in opposite directions between the first node and the second node,
the first inverter controls a potential level of the first node based on a potential level of the second node, and
the first inverter blocks a pull-up path of the first node during the data transmission operation.

13. A page buffer, comprising:
a sensing node, a potential of which is controlled based on an amount of current flowing through a bit line during a data sensing operation and based on a potential of a page buffer common node during a data transmission operation; and
a main latch component configured to latch data based on the potential of the sensing node,
wherein the main latch component is further configured to:
during the data transmission operation, set a first trip voltage by relatively strengthening a pull-down current path to latch the data depending on the set first trip voltage and the potential of the sensing node, and
during the data sensing operation, set a second trip voltage higher than the first trip voltage by relatively weakening the pull-down current path to latch the data depending on the set second trip voltage and the potential of the sensing node.

14. A semiconductor memory device, comprising:
a first precharger coupled to a page buffer common node and configured to precharge the page buffer common node to a first potential during a data transmission operation;
a cache latch component coupled to the page buffer common node and configured to maintain or discharge a potential of the page buffer common node based on data stored therein in the data transmission operation; and
a page buffer coupled to the page buffer common node, wherein the page buffer comprises:
a sensing node, a potential of which is controlled based on the potential of the page buffer common node during the data transmission operation; and
a main latch component configured to latch data based on the potential of the sensing node, and
wherein the main latch component is further configured to set a first trip voltage to latch the data depending on the set first trip voltage and the potential of the sensing node during the data transmission operation.

15. The semiconductor memory device according to claim 14, wherein the page buffer further comprises:
a second precharger configured to precharge the sensing node to a second potential higher than the first potential before the data transmission operation is performed.

16. The semiconductor memory device according to claim 14, wherein the potential of the sensing node is further controlled based on an amount of current flowing through a bit line during a data sensing operation.

17. The semiconductor memory device according to claim 16, wherein the main latch component latches the data depending on a second trip voltage and the potential of the sensing node during the data sensing operation, the first trip voltage and the second trip voltage being different.

18. The semiconductor memory device according to claim 17, wherein the first trip voltage is lower than the second trip voltage.

19. The semiconductor memory device according to claim 16, wherein:
the main latch component comprises a latch including a first node and a second node, and
the first node is configured such that resistance of a first pull-down current path during the data transmission operation is less than resistance of a second pull-down current path during the data sensing operation.

20. The semiconductor memory device according to claim 19, wherein the main latch further comprises:
first and second inverters coupled in parallel in opposite directions between the first node and the second node;
two or more first transistors coupled in parallel between the first node and a third node; and
a second transistor coupled between the third node and a ground power source and configured to be operated depending on the potential of the sensing node.

21. The semiconductor memory device according to claim 20, wherein the two or more first transistors are turned on together in response to a control signal during the data transmission operation to form the first pull-down current path between the first node and the third node.

22. The semiconductor memory device according to claim 20, wherein one of the two or more first transistors is turned on in response to a control signal during the data sensing operation to form the second pull-down current path between the first node and the third node.

23. The semiconductor memory device according to claim 20, wherein:
the main latch component further comprises a third transistor coupled between the second node and the third node, and
at least one of the first transistors has turn-on resistance less than turn-on resistance of the third transistor.

24. The semiconductor memory device according to claim 19, wherein the main latch component further comprises:
first and second inverters coupled in parallel in opposite directions between the first node and the second node;
a first transistor coupled between the first node and a third node and configured to be turned on during the data transmission operation and the data sensing operation;
second and third transistors coupled in series between the third node and a ground power source; and
a fourth transistor coupled between the third node and the ground power source.

25. The semiconductor memory device according to claim 24, wherein the second transistor and the fourth transistor are operated depending on the potential of the sensing node.

26. The semiconductor memory device according to claim 24, wherein:
the third transistor is operated in response to an enable signal, and the enable signal is activated during the data transmission operation and is deactivated during the data sensing operation.

27. The semiconductor memory device according to claim 24, wherein the main latch component is configured such that:
   during the data transmission operation, the first pull-down current path is formed through the second transistor, the third transistor, and the fourth transistor, and
   during the data sensing operation, the second pull-down current path is formed through the fourth transistor.

28. The semiconductor memory device according to claim 19, wherein:
   the latch includes first and second inverters coupled in parallel in opposite directions between the first node and the second node,
   the first inverter controls a potential level of the first node based on a potential level of the second node, and
   the first inverter blocks a pull-up path of the first node during the data transmission operation.

* * * * *